US 7,985,664 B2

(12) United States Patent
Hiura et al.

(10) Patent No.: US 7,985,664 B2
(45) Date of Patent: Jul. 26, 2011

(54) FILM FORMATION APPARATUS, METHOD FOR FORMING FILM, AND METHOD FOR MANUFACTURING PHOTOELECTRIC CONVERSION DEVICE

(75) Inventors: Yoshikazu Hiura, Yamanashi (JP); Hiroki Adachi, Yamanashi (JP); Hironobu Takahashi, Yamanashi (JP); Yuusuke Sugawara, Yamanashi (JP); Tatsuya Arao, Ebina (JP); Kazuo Nishi, Yamanashi (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/627,473

(22) Filed: Nov. 30, 2009

(65) Prior Publication Data

US 2010/0075455 A1 Mar. 25, 2010

Related U.S. Application Data

(62) Division of application No. 11/526,097, filed on Sep. 25, 2006, now Pat. No. 7,666,766.

(30) Foreign Application Priority Data

Sep. 27, 2005 (JP) ................................. 2005-279117

(51) Int. Cl.
*H01L 21/20* (2006.01)
*C23C 16/54* (2006.01)

(52) U.S. Cl. .............. 438/484; 257/E21.09; 118/723 R; 118/723 E

(58) Field of Classification Search ................. 118/718, 118/723 E, 723 MP, 729, 730, 723 R; 438/482, 438/483, 484; 257/E27.123, E27.124, E27.125, E21.09

See application file for complete search history.

(56) References Cited

U.S. PATENT DOCUMENTS

| 4,803,332 | A | | 2/1989 | Koyama et al. | |
|---|---|---|---|---|---|
| 4,920,917 | A | * | 5/1990 | Nakatani et al. | 118/718 |
| 4,951,602 | A | * | 8/1990 | Kanai | 118/719 |
| 5,266,116 | A | * | 11/1993 | Fujioka et al. | 118/718 |
| 5,382,531 | A | * | 1/1995 | Fujioka et al. | 438/484 |
| 5,430,484 | A | | 7/1995 | Nagane et al. | |
| 5,451,996 | A | | 9/1995 | Awai et al. | |
| 5,571,749 | A | * | 11/1996 | Matsuda et al. | 438/484 |
| 5,589,007 | A | * | 12/1996 | Fujioka et al. | 136/249 |
| 5,821,597 | A | | 10/1998 | Nakajima et al. | |

(Continued)

FOREIGN PATENT DOCUMENTS

JP 6-260421 * 9/1994

(Continued)

*Primary Examiner* — Mary Wilczewski
(74) *Attorney, Agent, or Firm* — Nixon Peabody LLP; Jeffrey L. Costellia

(57) ABSTRACT

The present invention relates to a film formation apparatus including a first transfer chamber having a roller for sending a substrate, a film formation chamber having a discharging electrode, a buffer chamber provided between the transfer chamber and the film formation chamber or between the film formation chambers, a slit provided in a portion where the substrate comes in and out in the buffer chamber, and a second transfer chamber having a roller for rewinding the substrate. The slit is provided with at least one touch roller, and the touch roller is in contact with a film formation surface of the substrate. In addition, the present invention also relates to a method for forming a film and a method for manufacturing a photoelectric conversion device that are performed by using such a film formation apparatus.

8 Claims, 31 Drawing Sheets

U.S. PATENT DOCUMENTS

| | | | |
|---|---|---|---|
| 6,256,459 B1 | 7/2001 | Hasegawa et al. | |
| 6,265,242 B1 | 7/2001 | Komori et al. | |
| 6,271,055 B1 | 8/2001 | Yajima et al. | |
| 6,273,955 B1 * | 8/2001 | Yoshino et al. | 118/718 |
| 6,312,767 B2 * | 11/2001 | Villermet et al. | 427/540 |
| 6,350,489 B1 * | 2/2002 | Moriyama et al. | 427/255.5 |
| 6,436,797 B1 * | 8/2002 | Fujioka et al. | 438/484 |
| 6,440,277 B1 | 8/2002 | D'Amato | |
| 6,562,400 B2 * | 5/2003 | Tamura et al. | 427/177 |
| 6,620,288 B2 | 9/2003 | Shinohara et al. | |
| 6,666,923 B1 * | 12/2003 | Jeong et al. | 118/723 R |
| 6,668,149 B2 | 12/2003 | Omata et al. | |
| 6,705,245 B1 * | 3/2004 | Jeong et al. | 118/723 E |
| 6,812,499 B2 * | 11/2004 | Kondo et al. | 257/95 |
| 6,827,787 B2 | 12/2004 | Yonezawa et al. | |
| 6,916,509 B2 | 7/2005 | Yonezawa et al. | |
| 7,666,766 B2 * | 2/2010 | Hiura et al. | 438/484 |
| 2001/0055647 A1 * | 12/2001 | Tamura et al. | 427/177 |
| 2004/0187783 A1 | 9/2004 | Maeda et al. | |
| 2005/0061246 A1 * | 3/2005 | Yonezawa et al. | 118/718 |
| 2005/0084618 A1 * | 4/2005 | Hirsch et al. | 427/458 |
| 2005/0172899 A1 * | 8/2005 | Fukuda et al. | 118/718 |
| 2005/0181606 A1 * | 8/2005 | Fukuda et al. | 438/675 |
| 2005/0227457 A1 * | 10/2005 | Kondo et al. | 438/479 |
| 2005/0235914 A1 | 10/2005 | Yonezawa et al. | |
| 2006/0199014 A1 * | 9/2006 | Il et al. | 428/411.1 |
| 2006/0283539 A1 | 12/2006 | Slafer | |
| 2008/0096291 A1 | 4/2008 | Takai et al. | |
| 2008/0199629 A1 * | 8/2008 | Simor et al. | 427/488 |
| 2008/0233283 A1 * | 9/2008 | Choi et al. | 427/226 |
| 2008/0268172 A1 * | 10/2008 | Fukuda et al. | 427/569 |
| 2009/0130607 A1 | 5/2009 | Slafer | |
| 2010/0024729 A1 * | 2/2010 | Cao et al. | 118/723 E |

FOREIGN PATENT DOCUMENTS

| | | | |
|---|---|---|---|
| JP | 2001-223375 | | 8/2001 |
| JP | 2007-119911 | * | 5/2007 |
| JP | 2007-227522 | | 9/2007 |

* cited by examiner

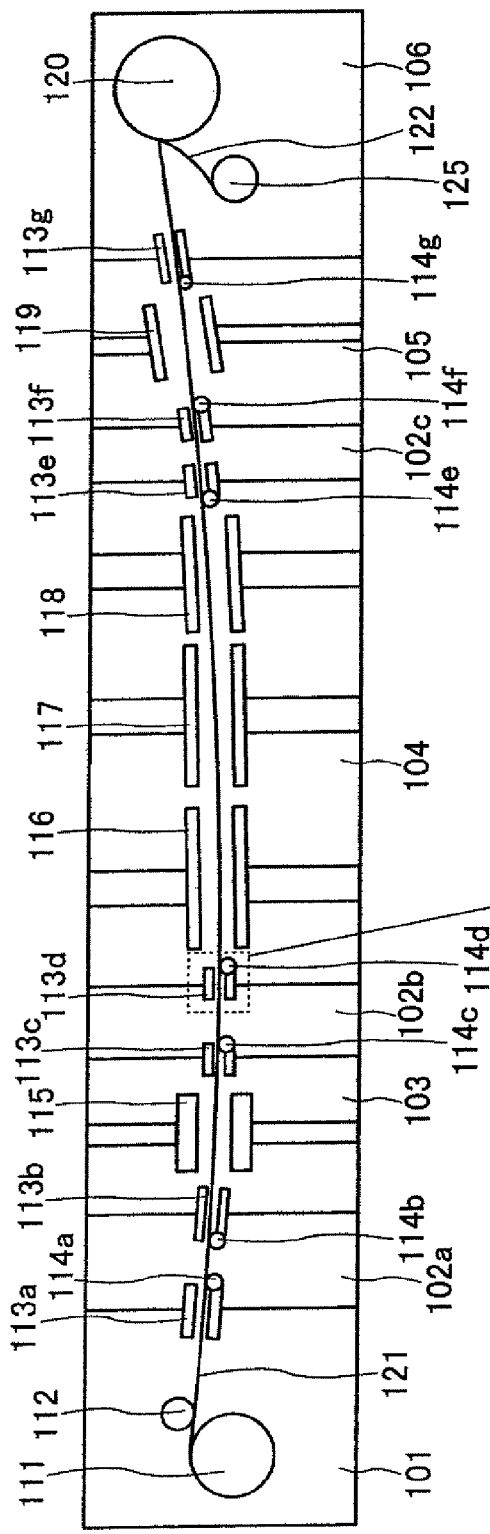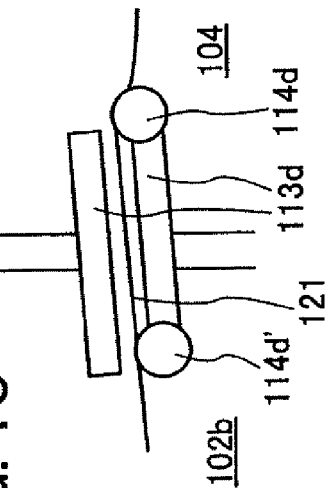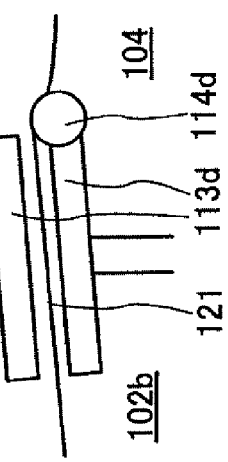

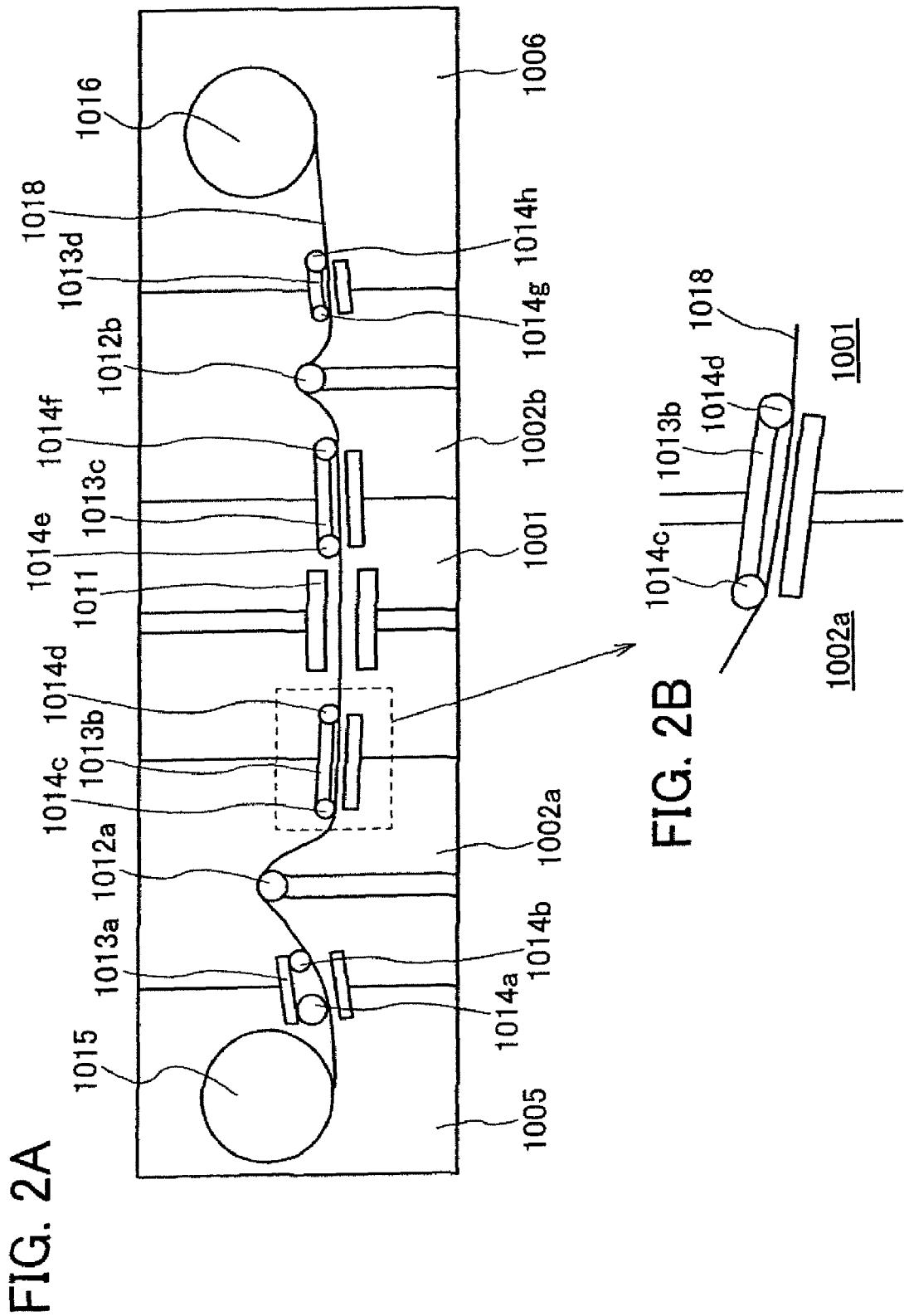

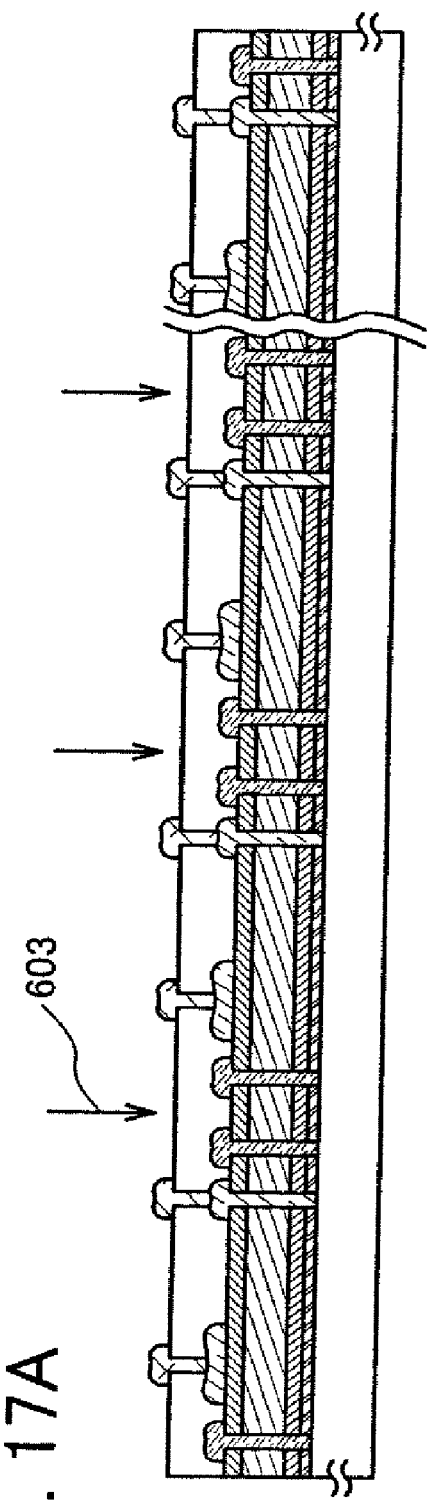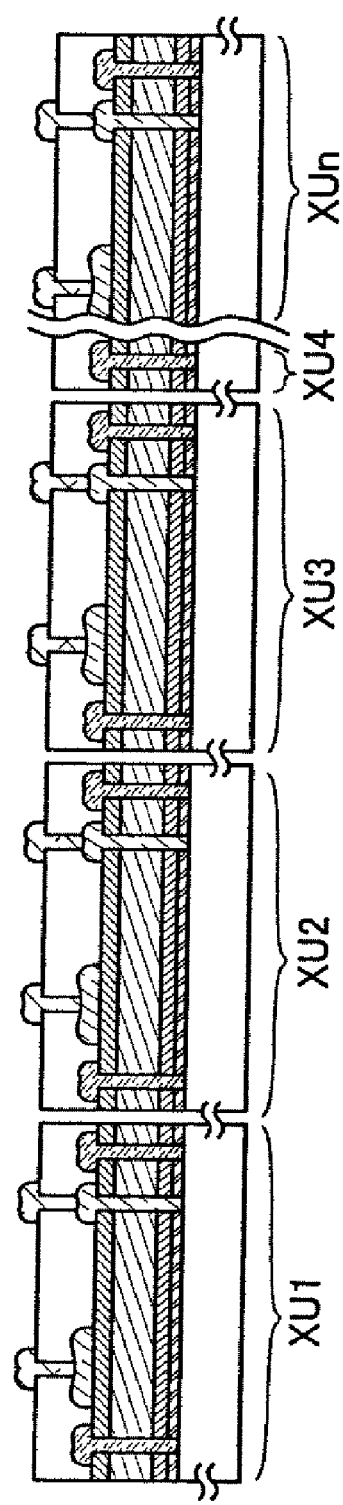
FIG. 17A
FIG. 17B

FILM FORMATION APPARATUS, METHOD FOR FORMING FILM, AND METHOD FOR MANUFACTURING PHOTOELECTRIC CONVERSION DEVICE

BACKGROUND OF THE INVENTION

1. Field of the Invention

The present invention relates to a photoelectric conversion element, a photoelectric conversion device, and a method for manufacturing the same. Further, the present invention also relates to an electronic appliance and a semiconductor device using a photoelectric conversion device.

2. Description of the Related Art

In recent years, a process in which a photoelectric conversion device can be manufactured at low cost has been expected. As one of methods for attempting low cost manufacture, a method has been known, by which each unit operation such as film formation, printing, or laser processing is continuously processed in a process where a rolled flexible substrate is rewound to another roll. This method is referred to as a Roll-to-Roll method (refer to Patent Document 1: Japanese Published Patent Application No. 2001-223375).

FIGS. 2A and 2B show a film formation apparatus for a conventional Roll-to-Roll method. A film formation apparatus of FIGS. 2A and 2B include a plurality of chambers, for example, a film formation chamber 1001, and buffer chambers 1002 (1002a and 1002b). In the film formation chamber 1001, a discharging electrode 1011 is provided. In each of the buffer chambers 1002a and 1002b, touch rollers 1012 (1012a and 1012b) are respectively provided. Slits 1013 (1013a, 1013b, 1013c, and 1013d) are respectively formed between a transfer chamber 1005 and the buffer chamber 1002a, between the buffer chamber 1002a and the film formation chamber 1001, between the film formation chamber 1001 and the buffer chamber 1002b, and between the buffer chamber 1002b and a transfer chamber 1006. In other words, the slit 1013b is provided between the film formation camber 1001 and the buffer chamber 1002a, and the slit 1013c is provided between the film formation chamber 1001 and the buffer chamber 1002b. Each slit is provided with touch rollers 1014 (1014a, 1014b, 1014c, 1014d, 1014e, 1014f, 1014g, and 1014h). In other words, the slit 1013a is provided with the touch rollers 1014a and 1014b, the slit 1013b is provided with the touch rollers 1014c and 1014d, the slit 1013c is provided with the touch rollers 1014e and 1014f, and the slit 1013d is provided with the touch rollers 1014g and 1014h.

A substrate 1018 that is sent from a roller (also called a bobbin) 1015 passes through each of the touch rollers 1012 and 1013 and the discharging electrode 1011, and then, is rewound by a roller 1016. A film is formed over the substrate 1018 between the discharging electrodes 1011 provided in the film formation chamber 1001.

However, in the conventional film formation apparatus of FIGS. 2A and 2B, there was possibility that the substrate 1018 is curled in passing through the touch rollers, in other words, a phenomenon occurs, in which the substrate 1018 is turned up toward a surface where a film is not formed (a rear surface). When the substrate 1018 is curled, a photoelectric conversion device may be difficult to be used as a product and a yield may be reduced.

Further, if the rear surface of the substrate 1018 is damaged by the touch rollers, light to be received may have adverse effect, or appearance quality may be deteriorated in being incorporated into a product.

SUMMARY OF THE INVENTION

It is an object of the present invention to suppress occurrence of a curled substrate in film formation and provide a highly reliable photoelectric conversion device by suppressing occurrence of damage in a light receiving region, thereby obtaining a photoelectric conversion device with high reliability.

According to one feature of the present invention, a film formation apparatus includes a first transfer chamber having a roller for sending a substrate, a film formation chamber having a discharging electrode, a buffer chamber provided between the transfer chamber and the film formation chamber or between the film formation chambers, a slit provided in a portion where the substrate comes in and out in the buffer chamber, and a second transfer chamber having a roller for rewinding a substrate; the slit is provided with at least one touch roller; and the touch roller is in contact with a film formation surface (a surface on which a film is formed) of the substrate.

According to one feature of the present invention, a method for forming a film includes the steps of sending a substrate from a roller for sending a substrate, which is provided in a first transfer chamber; forming a film over the substrate by making the substrate pass through a discharging electrode provided in a film formation chamber; transferring the substrate through a slit provided in a buffer chamber that is provided between the transfer chamber and the film formation chamber or between the film formation chambers; and rewinding the substrate over which the film is formed by a roller for rewinding a substrate, which is provided in a second transfer chamber. The slit is provided with at least one touch roller, and the touch roller is in contact with a surface of the substrate over which the film is formed.

In the present invention, the second transfer chamber is provided with a roller for sending a protective sheet (also referred to as a "protective film"); and the protective sheet is sent to be in contact with a film formation surface of the substrate and rewound together with the substrate by the roller for rewinding a substrate.

In the present invention, the discharging electrodes are composed of an upper electrode and a lower electrode, the upper electrode is formed of a plurality of parts, and insulators are formed between the plurality of parts of the upper electrode.

In the present invention, the film may be a semiconductor film, and the semiconductor film may be any one of a silicon film, a germanium film, and a silicon film containing germanium.

According to one feature of the present invention, a method for manufacturing a photoelectric conversion device includes the steps of sending a substrate from a roller for sending a substrate, which is provided in a first transfer chamber; forming a first semiconductor film over the substrate by making the substrate pass through first discharging electrodes provided in a first film formation chamber; transferring the substrate over which the first semiconductor film is formed through a first slit provided in a first buffer chamber; forming a second semiconductor film over the first semiconductor film by making the substrate pass through second discharging electrodes provided in a second film formation chamber; transferring the substrate over which the second semiconductor film is formed through a second slit provided in a second buffer chamber; forming a third semiconductor film having opposite conductivity to the first semiconductor film over the second semiconductor film by making the substrate pass through third discharging electrodes provided in a third film formation chamber; and rewinding the substrate over which the first to third semiconductor films are formed by a roller for rewinding a substrate, which is provided in a second transfer chamber. Each of the first slit and the second slit is provided with at least one touch roller, and the touch roller is in contact with a surface of the substrate over which the semiconductor film is formed.

In the present invention, the second transfer chamber is provided with a roller for sending a protective sheet, and the protective sheet is sent to be in contact with a surface over which the third semiconductor film is formed and rewound together with the substrate by a roller for rewinding a substrate.

In the present invention, the protective sheet may be a paper, a metal foil, or an organic film.

In the present invention, the second discharging electrodes are composed of an upper electrode and a lower electrode, the upper electrode is formed of a plurality of parts, and insulators are formed between the plurality of parts of the upper electrode In the present invention, the substrate may be any one of a polyethylene naphthalate (PEN) film, a polyethylene terephthalate (PET) film, and a polybutylene naphthalate (PBN) film.

In the present invention, each of the first to third semiconductor films may be any one of a silicon film, a germanium film, and a silicon film containing germanium.

In the present invention, the photoelectric conversion device may be a solar battery.

In the present invention, the photoelectric conversion device may be a photosensor.

In the present specification, a photoelectric conversion layer is a layer having a structure that is necessary for converting light energy into electric energy. For example, semiconductor layers of stacked p-type, i-type, and n-type films, semiconductor layers having a PN junction, or the like can be given. Further, when a semiconductor layer has a PIN structure, an intrinsic layer is a region where a carrier contributing to photoelectromotive force is generated. When a semiconductor layer has a PN junction, a depletion layer in a PN junction interface is a region where a carrier contributing to photoelectromotive force is generated. In other words, electrodes are connected to both edges of a photoelectric conversion layer, and the photoelectric conversion layer is irradiated with light; accordingly, photoelectromotive force can be extracted from the electrodes.

In the present specification, a photoelectric conversion element is an element having a photoelectric conversion layer, and a photoelectric conversion device is a device having one or a plurality of photoelectric conversion elements.

In the present specification, a semiconductor device indicates general devices capable of functioning by utilizing a semiconductor characteristic, and a photoelectric conversion device, a semiconductor circuit, an electrooptical device and an electronic appliance each of which has a semiconductor layer are all semiconductor devices.

In the present invention, a film is formed over a surface opposite to a light receiving region over a substrate so that a touch roller is in contact with a film formation surface. Thus, damage to the light receiving region of an element can be prevented. Therefore, a highly reliable photoelectric conversion device can be obtained.

In accordance with the present invention, occurrence of curl can be suppressed in a boundary between a region where a film is formed and a region where a film is not formed. Thus, damage to a light receiving region of an element can be prevented.

In accordance with the present invention, curling of a substrate can be suppressed, so that a substrate can be transferred smoothly. Therefore, a film formation apparatus having high stability for transfer can be obtained.

BRIEF DESCRIPTION OF DRAWINGS

FIGS. 1A to 1C are views showing a film formation apparatus of the present invention;

FIGS. 2A and 2B are views showing a conventional film formation apparatus;

FIGS. 5A to 5C are views showing a process for manufacturing a photoelectric conversion device of the present invention;

FIGS. 17A and 1713 are views showing a process for manufacturing a photoelectric conversion device of the present invention;

DETAILED DESCRIPTION OF THE INVENTION

Figure 3:
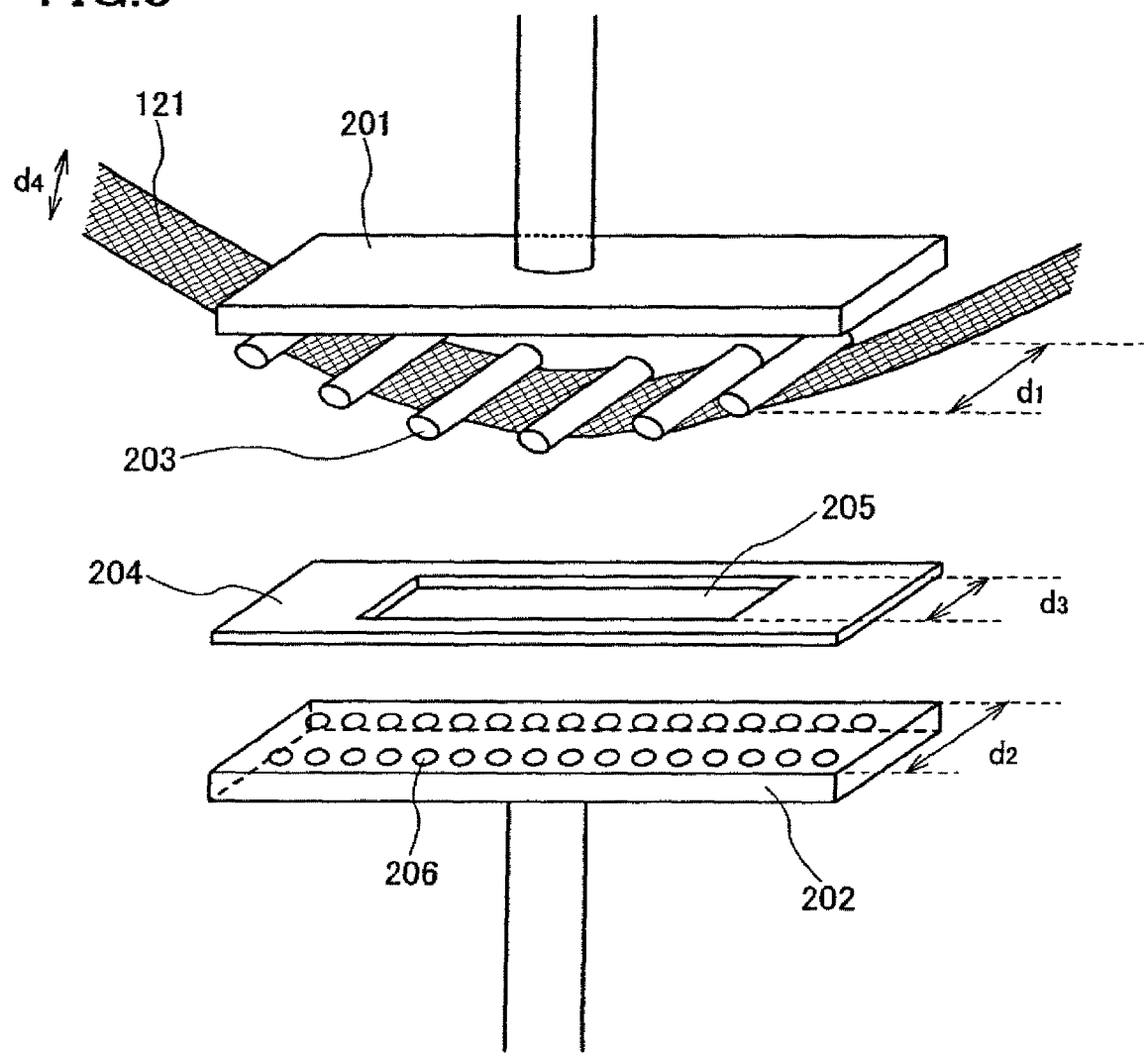
FIG. 3 is a view showing a film formation apparatus of the present invention.
Figure 4A:
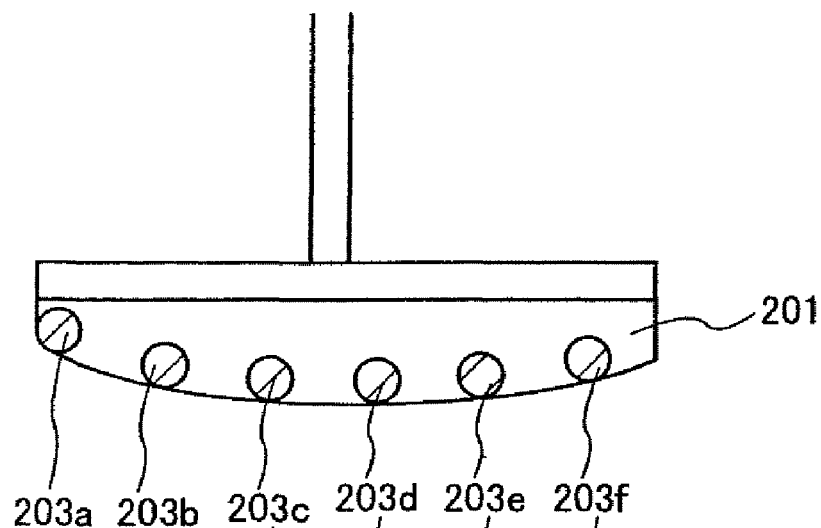
FIGS. 4A to 4C are views showing a film formation apparatus of the present invention.
Figure 4B:
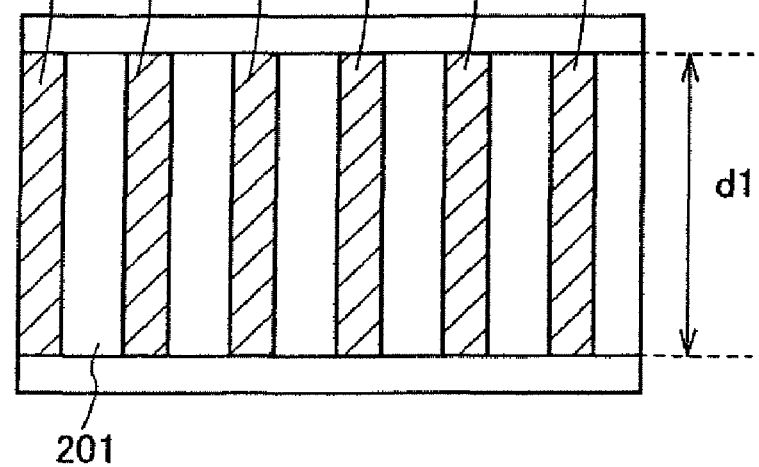
Figure 4C:
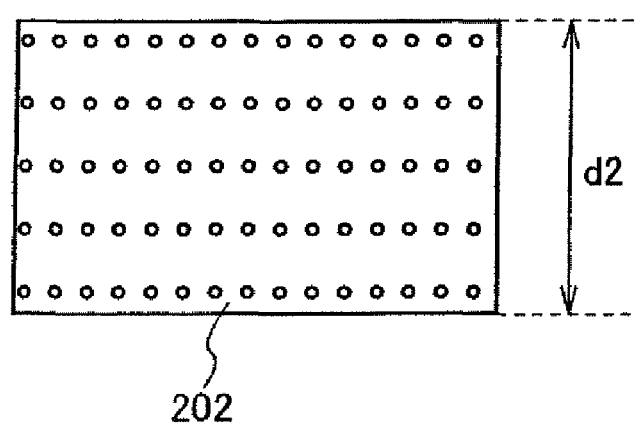

Embodiment Modes of the present invention will be explained in detail with reference to drawings. However, the present invention is not limited to the following explanation and is easily understood by those skilled in the art that various changes and modifications are possible, unless such changes and modifications depart from the content and the scope of the invention. Therefore, the present invention is not construed as being limited to descriptions of the following Embodiment Modes. It is to be noted that, in structures of the present invention explained below, reference numeral denoting the same portion is used in common among different drawings.

Embodiment Mode 1

This embodiment mode will be explained with reference to FIGS. 1A to 1C, FIG. 3, FIGS. 4A to 4C, and FIGS. 5A and 5B.

FIG. 1A shows an overall view of a film formation apparatus of this embodiment mode, and FIGS. 1B and 1C show views of an enlarged slit and touch roller. The film formation apparatus shown in FIG. 1A includes transfer chambers 101 and 106, buffer chambers 102 (102a, 102b, and 102c), and film formation chambers 103, 104, and 105.

In the transfer chamber 101, a roller 111 and a touch roller 112 for sending a substrate 121 are provided. The substrate 121 is a flexible substrate, and for example, a polyethylene naphthalate (PEN) film, a polyethylene terephthalate (PET) film, a polybutylene naphthalate (PBN) film, or the like may be used. The substrate 121 is sent from the roller 111 to the buffer chamber 102.

The buffer chamber 102 is provided between the transfer chamber and the film formation chamber or between the film formation chambers. By transferring a substrate to the film formation chamber through the buffer chamber, each film can be formed in separate film formation chambers.

In portions where the substrate 121 comes in and out in the buffer chamber 102, a slit 113 is provided. Each slit 113 (113a, 113b, 113c, 113d, 113e, 113f, and 113g) is provided with a touch roller 114 (114a, 114b, 114c, 114d, 114e, 114f, and 114g). In other words, the slits 113a and 113b are provided to the buffer chamber 102a, and the slits 113a and 113b are respectively provided with the touch rollers 114a and 114b. Further, the slits 113c and 113d are provided to the buffer chamber 102b, and the slits 113c and 113d are respectively provided with the touch rollers 114c and 114d. The slits 113e and 113f are provided to the buffer chamber 102c, and the slits 113e and 113f are respectively provided with the touch rollers 114e and 114f.

Further, the slit 113g is provided between the film formation chamber 105 and the transfer chamber 106, and the slit 113g is provided with the touch roller 114g.

FIG. 1B shows an enlarged view of the slit 113d provided between the buffer chamber 102b and the film formation chamber 104 and the touch roller 114d. Other slits and touch rollers have the same structure as the slit 113d and the touch roller 114d. The substrate 121 is in contact with the touch roller 114d when passing through the slit 113d. A film is formed on a surface of the substrate 121, which is in contact with the touch roller 114d. The touch roller 114d is in contact with only an edge portion of a film formation surface of the substrate 121. A light receiving region of an element is mainly a surface opposite to the film formation surface of the substrate 121; therefore, the touch roller is in contact with the film formation surface, whereby damage to the light receiving region of an element can be prevented.

In FIGS. 1A and 1B, one touch roller is provided for each slit. However, the number of the touch rollers is not necessary to be one slit for each, and two or more touch rollers may be provided if necessary as long as a film formation surface is not damaged. For example, two touch rollers 114d and 114d' may be provided for the slit 113d as shown in FIG. 1C. Alternatively, the number of the touch rollers may be changed depending on a slit. For example, one touch roller may be provided for one slit, and plural touch rollers, e.g., two touch rollers may be provided for another slit.

In each of the film formation chambers 103, 104, and 105, a semiconductor film may be formed by a plasma CVD method. In this embodiment mode, the film formation chamber 103 is provided with a discharging electrode 115. When the substrate 121 passes through the discharging electrodes 115, a first semiconductor film, which is a p-type semiconductor film in this embodiment mode, is formed. As the p-type semiconductor film, a semiconductor film containing an impurity element belonging to Group 13 of the periodic table, for example, boron (B), more specifically, a p-type amorphous silicon film may be formed.

Further, instead of silicon, germanium or silicon containing germanium (silicon germanium) may be used. Instead of an amorphous semiconductor film, a semiamorphous semiconductor film may be used.

It is to be noted that a semiamorphous semiconductor film indicates a film including a semiconductor that has an intermediate structure between an amorphous semiconductor and a semiconductor having a crystalline structure (including single crystal and polycrystal). The semiamorphous semiconductor film is a semiconductor film having a third condition that is stable in term of free energy and is a crystalline substance having a short-range order and lattice distortion. A crystal grain thereof can be dispersed in the non-single crystalline semiconductor film by setting a grain size thereof to be 0.5 to 20 nm. Raman spectrum thereof is shifted toward lower wave number side than 520 cm$^{-1}$. The diffraction peaks of (111) and (220), which are considered to be derived from a Si crystal lattice, are observed in the semiamorphous semiconductor film by X-ray diffraction. The semiamorphous semiconductor film contains at least 1 atomic % or more of hydrogen or halogen as a material for terminating a dangling bond. In this specification, such a semiconductor film is referred to as a semiamorphous semiconductor (SAS) film for the sake of convenience. The lattice distortion is further extended by including a rare gas element such as helium, argon, krypton, and neon so that a favorable semiamorphous semiconductor film with improved stability can be obtained. It is to be noted that a microcrystalline semiconductor film is also included in a semiamorphous semiconductor film.

An SAS film can be obtained by glow discharge decomposition of a gas containing silicon. $SiH_4$ is a typical gas containing silicon, and additionally, $Si_2H_6$, $SiH_2Cl_2$, $SiHCl_3$, SiCl$_4$, SiF$_4$, or the like can be used. An SAS film can be easily formed by using the gas containing silicon diluted with hydrogen or gas in which one or more of rare gas elements selected from helium, argon, krypton, and neon are added to hydrogen. The gas containing silicon is preferably diluted with a dilution ratio in a range of twice to 1000 times. In addition, a carbide gas such as CH$_4$ or C$_2$H$_6$; a germanide gas such as GeH$_4$ and GeF$_4$; F$_2$; and the like may be mixed into the gas containing silicon to adjust the width of an energy band at 1.5 to 2.4 eV or 0.9 to 1.1 eV.

The film formation chamber 104 is provided with discharging electrodes 116, 117, and 118. In the film formation chamber 104, an i-type semiconductor film (also referred to as an "intrinsic semiconductor film") as a second semiconductor film is formed. Since the i-type semiconductor film is often formed to be thick, three discharging electrodes are provided. A discharging electrode which is three times larger than the area may be formed; however, there is a possibility that electric power to be supplied becomes unstable, and film quality of a formed film becomes ununiform due to an ununiform generated voltage. Therefore, by separating the electrode, a film having further higher quality can be obtained.

Although three discharging electrodes 116 to 118 are used for forming an i-type semiconductor film in this embodiment mode, it is needless to say that the number of the discharging electrodes is not limited thereto. Two discharging electrodes may be provided, and also four or more discharging electrodes may be provided. Further, one discharging electrode is sufficient as long as stable electric power can be supplied.

It is to be noted that the i-type semiconductor film may be any one of an i-type amorphous silicon film, an i-type amorphous germanium film, an i-type amorphous silicon germanium film, an i-type semiamorphous silicon film, an i-type semiamorphous germanium film, and an i-type semiamorphous silicon germanium film.

In the present specification, the i-type semiconductor film indicates a semiconductor film in which an impurity imparting p-type or n-type conductivity has a concentration of $1 \times 10^{20}$ cm$^{-3}$ or less, oxygen and nitrogen each have a concentration of $5 \times 10^{19}$ cm$^{-3}$ or less, and photoconductivity of 1000 times or more with respect to dark conductivity is included. Further, an element belonging to Group 13 of a periodic table, for example, boron (B) of 10 to 1000 ppm, may be added to the i-type semiconductor film.

The film formation chamber 105 is provided with a discharging electrode 119. In the film formation chamber 105, a third semiconductor film having opposite conductivity to that of the first semiconductor film, which is an n-type semiconductor film in this embodiment mode, is formed. As an n-type semiconductor film, a semiconductor film containing an impurity element belonging to Group 15 of a periodic table, for example phosphorus (P) may be formed.

Further, in the same manner as the i-type semiconductor film, an n-type semiconductor film may be any one of an n-type amorphous silicon film, an n-type amorphous germanium film, an n-type amorphous silicon germanium film, an n-type semiamorphous silicon film, an n-type semiamorphous germanium film, and an n-type semiamorphous silicon germanium film.

Although a p-type semiconductor film, an i-type semiconductor film, and an n-type semiconductor film are stacked in this order in this embodiment mode, a p-type semiconductor film and an n-type semiconductor film may be stacked in a reverse order. In other words, an n-type semiconductor film, an i-type semiconductor film, and a p-type semiconductor film may be stacked in this order.

The transfer chamber 106 is provided with a roller 120 for rewinding a substrate and a roller 125. A protective sheet 122 is sent to be in contact with the film formation surface of the substrate 121 from the roller 125, and is rewound together with the substrate 121 by the roller 120.

The protective sheet 122 is formed of, for example, paper, metal foil, an organic film, or the like. When the substrate 121 is rewound by the roller 120, the substrate 121 can be rewound so that the film formation surface of the substrate 121 is not in contact with a rear surface thereof.

Dust is attached to the rear surface of the substrate 121 in a process of the film formation. If the substrate 121 is directly rewound to the roller 120 with dust, the film formation surface is damaged. Therefore, it is effective for protecting the film formation surface to rewind the protective sheet 122 so as to be in contact with the film formation surface together with the substrate 121 to the roller 120.

The numbers of buffer chambers, film formation chambers, touch rollers, slits, and discharging electrodes are not limited to this embodiment mode. It is needless to say that the numbers thereof may be changed as needed.

The substrate 121 is bent by self-weight in a process of transferring the substrate 121. Therefore, the touch roller, the slit, the discharging electrode, and the like may be provided by changing a height thereof from a floor or ceiling of a device depending on bending of the substrate as shown in FIG. 1A.

Here, a detailed structure of the discharging electrodes 115 to 119 are shown in FIG. 3, FIGS. 4A to 4C, and FIGS. 5A and 5B.

Each of the discharging electrodes 115 to 119 includes an upper electrode 201, roll electrodes 203 (203a, 203b, 203c, 203d, 203e, and 203f), and a lower electrode 202.

The roll electrodes 203a to 203f are arranged along the bending of the substrate 121.

The lower electrode 202 has a hollow structure, and vents 206 of gas are formed on a surface of the lower electrode. Such an electrode is referred to as a shower electrode in the present specification. A material gas necessary for film formation gushes from this vent 206, and is decomposed by plasma generated between the upper electrode 201 and the roll electrode 203, and the lower electrode 202. In such a manner, a film is formed on a surface (a lower surface in FIG. 3) of the substrate 121.

A mask 204 for preventing a plasma space from expanding may be provided between the substrate 121 and the lower electrode 202 as needed.

Here, length of the roll electrode 203 is set to be $d_1$. Length of the lower electrode 202 in a perpendicular direction to a direction of transferring the substrate 121, in other words, length in a longitudinal direction of the lower electrode is set to be $d_2$. Length of an opening 205 in the mask 204 in a perpendicular direction to a direction of transferring the substrate 121, in other words, length in a longitudinal direction of the opening 205 in the mask 204 is set to be $d_3$. Width of the substrate 121 is set to be $d_4$. When the above conditions are employed, it is preferable to satisfy a relation of Formula 1.

$$d_1 > d_3 > d_4 \qquad \text{[Formula 1]}$$

In a case where the length $d_3$ in a longitudinal direction of the opening 205 in the mask 204 is set to be shorter than the width $d_4$ of the substrate 121 (that is, in a case of $d_3 < d_4$), an edge portion of the substrate 121 has a region where a film is formed (a film formation region) and a region where a film is not formed (a non-film formation region). Curling occurs in a boundary between the film formation region and the non-film formation region, and then, the substrate may be turned up. Therefore, there is a possibility that problems occur in subsequent processes. Thus, it is preferable to satisfy Formula 1 in a case of providing the mask 204.

Alternatively, in a case of not providing the mask 204, it is preferable to satisfy a relation of Formula 2.

$$d_1 > d_2 > d_4 \quad \text{[Formula 2]}$$

If the mask 204 is not provided, in a case where the length $d_2$ in a longitudinal direction of the lower electrode 202 is set to be shorter than the width $d_4$ of the substrate 121 (that is, in a case of $d_2 < d_4$), the substrate 121 is protruded from the lower electrode 202, and an edge portion of the substrate 121 has a region where a film is formed and a region where a film is not formed. Therefore, in order to prevent occurrence of curling as the same as the case of providing the mask 204, it is preferable to satisfy Formula 2 in a case of not providing the mask 204.

Embodiment Mode 2

In this embodiment mode, an example of a different structure of the film formation chamber 104 in FIGS. 1A to 1C from that of Embodiment Mode 1 will be explained with reference to FIG. 6 and FIG. 7.

Figure 6:
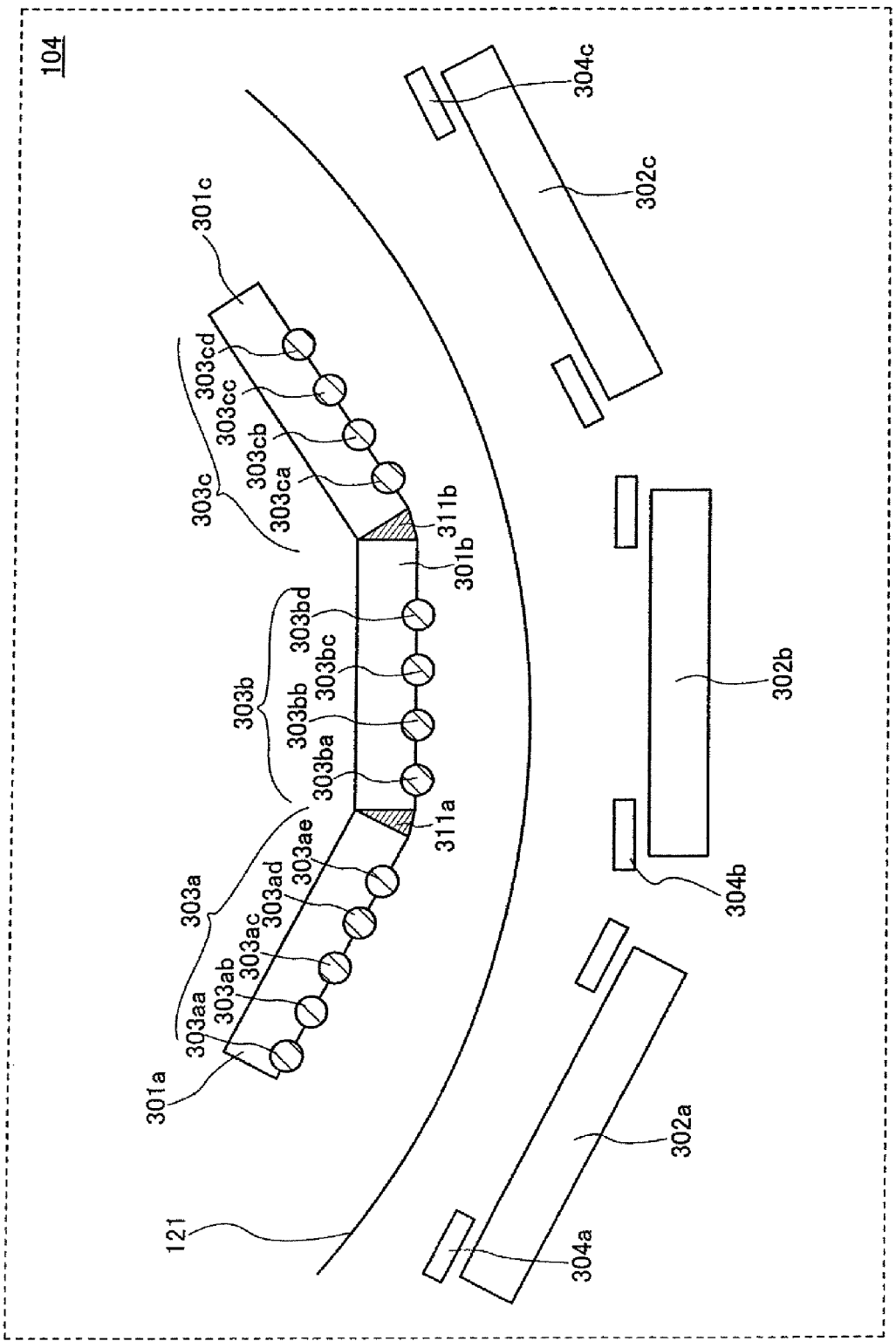
FIG. 6 is a view showing a film formation apparatus of the present invention.
Figure 7:
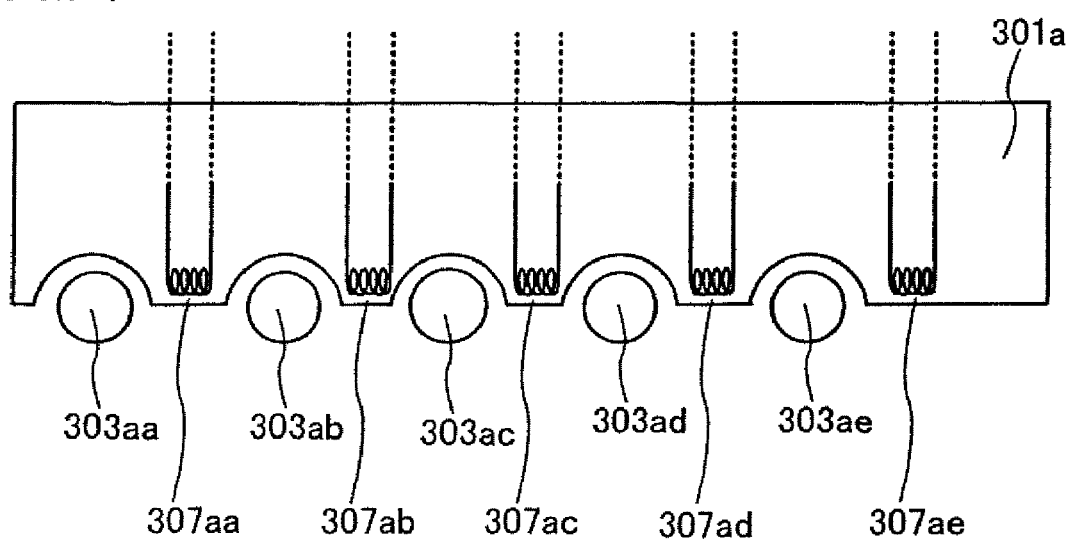
FIG. 7 is a view showing a film formation apparatus of the present invention.

FIG. 6 shows a state in which a substrate 121 is transferred between upper electrodes 301 (301a, 301b, and 301c) and lower electrodes 302 (302a, 302b, and 302c) of a discharging electrode provided in a film formation chamber. Masks 304 (304a, 304b, and 304c) are provided between the substrate 121 and the lower electrodes 302. In other words, the lower electrode 302a is provided with the mask 304a, the lower electrode 302b is provided with the mask 304b, and the lower electrode 302c is provided with the mask 304c.

The upper electrode 301 is divided into a plurality of upper electrodes, for example, three upper electrodes 301a, 301b, and 301c, each of which has a roll electrode 303. In other words, the upper electrode 301a is provided with the roll electrodes 303a (303aa, 303ab, 303ac, 303ad, and 303ae), the upper electrode 301b is provided with the roll electrodes 303b (303ba, 303bb, 303bc, and 303bd), and the upper electrode 301c is provided with the roll electrodes 303c (303ca, 303cb, 303cc, and 303cd).

Insulators 311 (311a and 311b) are formed between the upper electrodes 301. In other words, the insulator 311a is formed between the upper electrodes 301a and 301b, and the insulator 311b is formed between the upper electrodes 301b and 301c.

By forming the insulators 311, a plasma space can be surrounded. If the insulator 311 is not formed, the upper electrodes 301 become one large electrode and electric power that is shared at one time becomes large, which is not preferable. Further, the plasma space may become large and unstable; therefore, there is a possibility of adverse effect on film formation.

In addition, a heater 307 may be provided inside each of the upper electrodes 301. FIG. 7 shows an example in which a heater is provided in the upper electrode 301a. Heaters 307aa to 307ae are provided between or next to the roll electrodes 303aa to 303ae. By providing the heaters 307, a temperature can be uniformed, and then, further stable plasma can be generated.

It is needless to say that the number of upper electrodes, roll electrodes, lower electrodes, insulators, and heaters is not limited to this embodiment mode, and the number thereof may be changed as needed.

In this embodiment mode, the film formation chamber 104 of Embodiment Mode 1, that is, a film formation chamber forming an i-type semiconductor film, is described. However, a film formation chamber forming a p-type semiconductor film and a film formation chamber forming an n-type semiconductor film may have the same structure, if necessary.

It is to be noted that this embodiment mode can be combined with any description in Embodiment Mode 1, if necessary.

Embodiment 1

In this embodiment, a method for manufacturing a solar battery by the present invention will be explained with reference to FIGS. 5A to 5C, FIGS. 9A to 9C, FIG. 10, FIGS. 11A to 11C, FIG. 12, and FIGS. 13A and 13B.

Figure 8A:
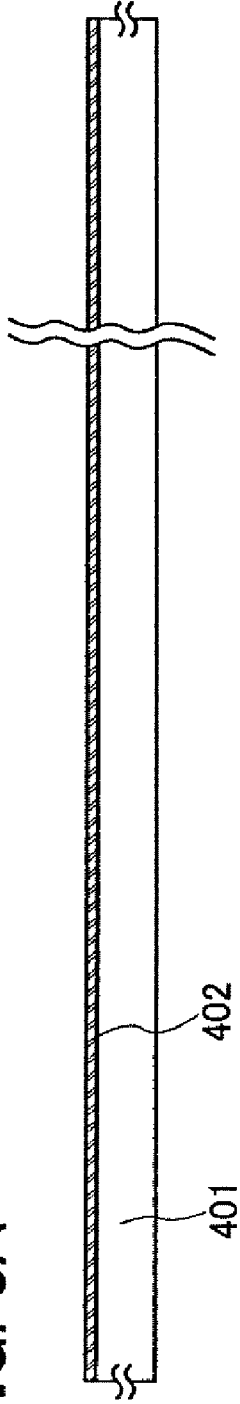

In FIG. 8A, as for a substrate 401, an organic resin material such as polyethylene terephthalate (PET), polyethylene naphthalate (PEN), polyether sulfone (PBS), or polybutylene naphthalate (PBN) is used. In this embodiment, polyethylene naphthalate (PEN) with a thickness of 60 to 100 μm is used as the substrate 401.

A solar battery manufactured in this embodiment is an integrated solar battery in which a plurality of unit cells is connected in series over the same substrate. Further, the solar battery of this embodiment has a structure in which light is received in a surface opposed to a surface over which a photoelectric conversion layer is formed over the substrate 401. A transparent electrode layer 402 is first formed over the substrate 401. The transparent electrode layer 402 is formed from indium tin oxide alloy (also referred to as indium tin oxide (ITO)), zinc oxide (ZnO), tin oxide (SnO$_2$), ITO-ZnO alloy, or the like to have a thickness of 40 to 200 nm (preferably, 50 to 100 nm). Since a continuously usable maximum temperature of the above organic risen material is 200° C. or less, the transparent electrode layer 402 is formed by a sputtering method, a vacuum evaporation method, or the like, and the film formation is performed while the substrate temperature is limited within the range from a room temperature to approximately 150° C. Detailed manufacturing conditions may be appropriately determined by an operator to obtain sheet resistance of 20 to 200 Ω/square for the above film thickness.

In terms of lowering resistance of the transparent electrode layer 402, an ITO film is suitable. However, if an ITO film is exposed to a plasma atmosphere containing hydrogen in a case of forming a semiconductor layer thereover, a light transmitting property of the ITO film is deteriorated because of reduction. In order to prevent this, it is preferable that a SnO$_2$ film or a ZnO film be formed over the ITO film. The ZnO (ZnO:Ga) film containing gallium (Ga) of 1 to 10 wt % has a high transmittance and is suitable to be stacked over the ITO film. As an example of a combination thereof, when the ITO film is formed to have a thickness of 50 to 60 nm and the ZnO:Ga film is formed thereover to have a thickness of 25 nm, it is possible to prevent a light transmitting property from being deteriorated, and a favorable light transmitting property can be obtained. In this stacked film, sheet resistance of 120 to 150 Ω/square can be obtained.

A non-single crystalline semiconductor film that is formed by using a film formation apparatus of the present invention is formed as a photoelectric conversion layer 405 over the transparent electrode layer 402. The film formation apparatus of the present invention is described in detail in Embodiment Modes 1 and 2; therefore, it is omitted here. Typically, the photoelectric conversion layer 405 is formed of a hydrogenated amorphous silicon (a-Si:H) film manufactured using a SiH$_4$ gas as a raw material. Besides, a hydrogenated amorphous silicon-germanium (a-SiGe:H) film, a hydrogenated amorphous silicon-carbon (a-SiC:H) film, a hydrogenated microcrystalline silicon (μc-Si:H) film, or the like is used. The photoelectric conversion layer 405 has a structure in which a first semiconductor layer, a second semiconductor layer, and a third semiconductor layer having opposite conductivity to the first semiconductor layer are formed by a PIN junction. In the photoelectric conversion layer 405, p-type and n-type layers with valence electron control may be formed by using a-Si:H or μc-Si:H to which a p-type impurity (such as boron) or an n-type impurity (such as phosphorus or arsenic) is added. Especially, μc-Si:H is suitable for the purpose of lowering light absorption loss or making favorable ohmic contact with the transparent electrode or a rear surface electrode.

Figure 8B:
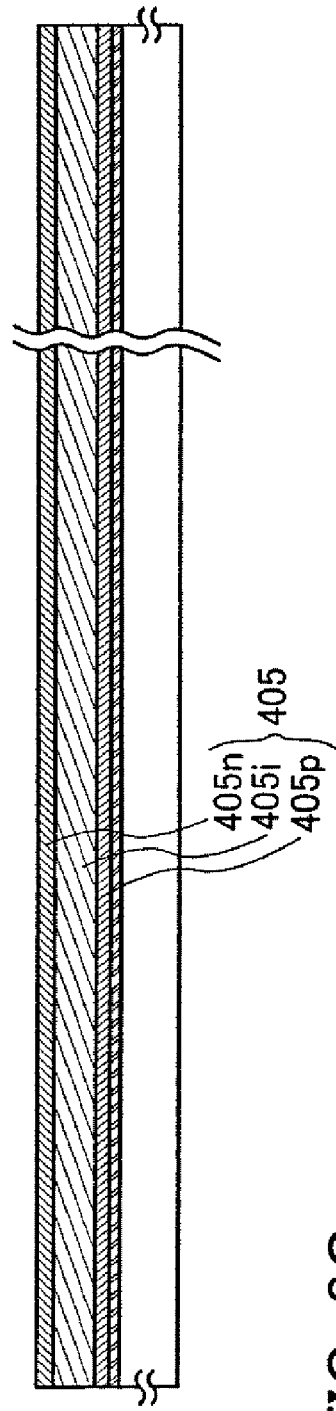

In the photoelectric conversion layer 405, as the first semiconductor layer, the second semiconductor layer, and the third semiconductor layer, a p-type semiconductor layer, an intrinsic semiconductor layer (also referred to as an "i-type semiconductor layer"), and an n-type semiconductor layer may be stacked in this order. Alternatively, an n-type semiconductor layer, an i-type semiconductor layer, and a p-type semiconductor layer may be stacked in this order. FIG. 8B shows a state in which a p-type semiconductor layer 405$p$, an i-type semiconductor layer 405$i$, and an n-type semiconductor layer 405$n$ are stacked in this order from a transparent electrode layer 402 side as the photoelectric conversion layer 405. The p-type semiconductor layer 405$p$, the i-type semiconductor layer 405$i$, and the n-type semiconductor layer 405$n$ respectively have a thickness of 10 to 20 nm, 200 to 1000 nm, and 20 to 60 nm. When a PIN junction is formed of such a non-single crystal silicon material, an open circuit voltage of approximately 0.4 to 1 V can be obtained. If this PIN junction is assumed to be one unit and a plurality of such units are stacked to form a stack type structure, the open circuit voltage can also be raised.

In the present specification, an i-type semiconductor layer indicates a semiconductor layer in which an impurity imparting p-type or n-type conductivity has a concentration of $1 \times 10^{20}$ cm$^3$ or less, oxygen and nitrogen each have a concentration of $5 \times 10^{19}$ cm$^{-3}$ or less, and photoconductivity of 1000 times or more with respect to dark conductivity is included. Further, boron (B) of 10 to 1000 ppm may be added to the i-type semiconductor layer.

Figure 8C:
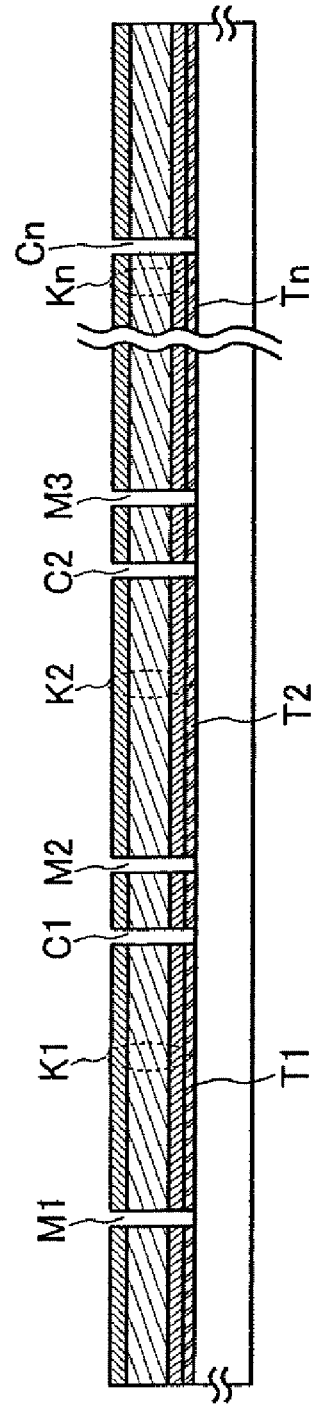

Then, as shown in FIG. 8C, in order to form a plurality of unit cells over the same substrate, openings $M_1$ to $M_n$ and $C_1$ to $C_n$ are formed in the photoelectric conversion layer 405 by a laser processing method (laser scribe). The openings $C_1$ to $C_n$ that are openings for electrically isolation are provided to form unit cells $U_1$ to $U_n$, and the openings $M_1$ to $M_n$ are openings for forming a connection between the transparent electrode layer and a rear surface electrode layer. It is to be noted that the openings $M_1$ to $M_n$ and $C_1$ to $C_n$ reach the substrate 401 in FIG. 8C; however, the openings $M_1$ to $M_n$ may be formed so that transparent electrode layers $T_1$ to $T_n$, connection electrode layers $E_1$ to $E_n$, and rear surface electrode layers $D_1$ to $D_{n+1}$ are electrically connected to each other in the subsequent processes. That is, the openings $M_1$ to $M_n$ may be formed to reach the substrate 401 or to reach the transparent electrode layer 402. In addition, the openings $C_1$ to $C_n$ may be formed so as to electrically isolate an element in the subsequent processes. A kind of a laser used for a laser processing method is not limited; however, an Nd-YAG laser, an excimer laser, or the like is used. In any case, by performing a laser process in a state where the transparent electrode layer 402 and the photoelectric conversion layer 405 are stacked, it is possible to prevent the transparent electrode layer from being peeled off from the substrate in the laser process.

In such a manner, the transparent electrode layer 402 is divided into $T_1$ to $T_n$, and the photoelectric conversion layer 405 is divided into $K_1$ to $K_n$.

Figure 9A:
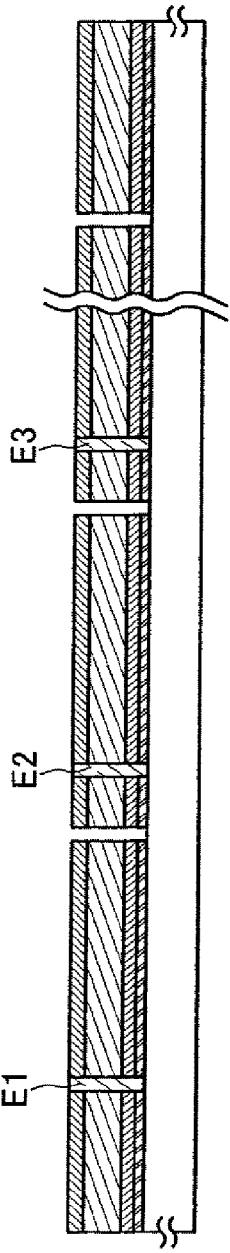
FIGS. 9A to 9C are views showing a process for manufacturing a photoelectric conversion device of the present invention.

Next, as shown in FIG. 9A, the openings $M_1$ to $M_n$ are filled with a conductive paste by an ink jet method, a screen printing method, or the like to form the connection electrode layers $E_1$ to $E_n$.

As a conductive paste, a conductive paste containing a metal material such as silver (Ag), gold (Au), copper (Cu), or nickel (Ni) or a conductive carbon paste can be used. In this embodiment, the connection electrode layers $E_1$ to $E_n$ are formed using a silver (Ag) paste.

Subsequently, the openings $C_1$ to $C_n$ are filled with insulating resin layers $Z_1$ to $Z_n$ to electrically isolate an element. The insulating resin layers $Z_1$ to $Z_n$ are formed by an ink jet method, a screen printing method, or the like.

In a case where the insulating resin layers $Z_1$ to $Z_n$ are formed by an ink jet method, as a material of the insulating resin layer, a composition including a photosensitive material may be used. For example, a positive resist obtained by dissolving or dispersing a novolac resin and a naphthoquinonediazide compound that is a photosensitive material in a solvent; or a negative resist obtained by dissolving or dispersing a base resin, diphenylsilanediol, an acid generating agent, and the like in a solvent is used. As the solvent, an organic solvent like esters such as butyl acetate or ethyl acetate, alcohols such as isopropyl alcohol or ethyl alcohol, methyl ethyl ketone, or acetone is used. A concentration of the solvent may be appropriately set depending on a kind or the like of a resist.

In a case where the insulating resin layers $Z_1$ to $Z_n$ are formed by a screen printing method, the insulating resin layers $Z_1$ to $Z_n$ are formed according to the following steps. A phenoxy resin, cyclohexane, isophorone, high resistance carbon black, aerosil, a dispersing agent, a defoaming agent, and a leveling agent are prepared as insulating resin raw materials for forming the insulating resin layers $Z_1$ to $Z_n$.

First, among the above raw materials, the phenoxy resin is completely dissolved in a mixture solvent of cyclohexanone and isophorone, and is dispersed for 48 hours by a ball mill made of zirconia with carbon black, aerosil, and the dispersing agent. Next, the defoaming agent and the leveling agent are added and are further mixed for two hours. Then, a thermal crosslinking reactive resin such as an n-butylated melamine resin and a hardening accelerator are added thereto.

These are further mixed and dispersed to obtain an insulating resin composition for a passivation film.

An insulating film is formed by a screen printing method using the obtained insulating resin composition ink. After coating with the insulating resin composition ink, thermal hardening is performed in an oven for 20 minutes at 160° C. to obtain the insulating resin layers $Z_1$ to $Z_n$.

Although the connection electrode layers $E_1$ to $E_n$ are formed first in this embodiment, either the connection electrode layers $E_1$ to $E_n$ and the insulating resin layers $Z_1$ to $Z_n$ may be formed first.

Figure 9B:
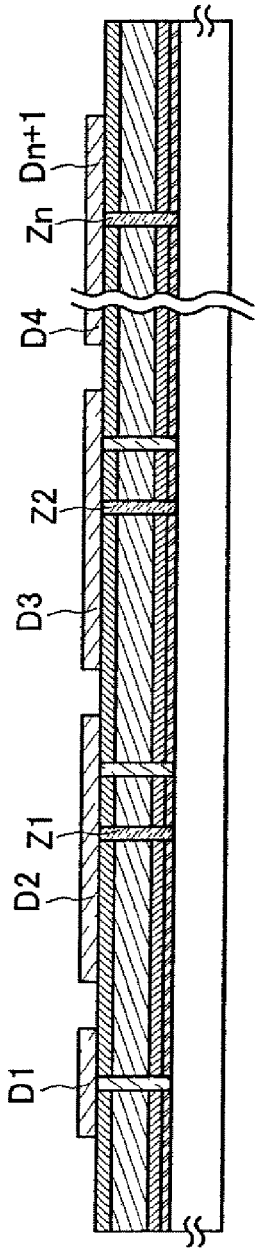

Next, the rear surface electrode layers $D_1$ to $D_{n+1}$ are formed as shown in FIG. 9B. The rear surface electrode layers $D_1$ to $D_{n+1}$ may be formed by a sputtering method, an evaporation method, a plating method, a screen printing method, an ink jet method, or the like.

In a case where a sputtering method is used, an element selected from tantalum (Ta), tungsten (W), titanium (Ti), molybdenum (Mo), or aluminum (Al), or an alloy material or a compound material containing the above elements as a main component can be used as a material for the rear surface electrode layers $D_1$ to $D_{n+1}$. In a case where an ink jet method is used, a conductive paste containing a metal material such as silver (Ag), gold (Au), copper (Cu), or nickel (Ni) can be used as a material for the rear surface electrode layers $D_1$ to $D_{n+1}$.

A method for forming the rear surface electrode layers $D_1$ to $D_{n+1}$ by a screen printing method is explained below. A graphite powder, a high conductive black, an oleic acid (dispersing agent), and isophorone (solvent) are prepared as an ink to be used.

These materials are put into a ball mill to be crushed to obtain finer particles. Then, 20 wt % of γ-butyrolactone lacquer of a saturated polyester resin is added thereto.

Then, the defoaming agent and the leveling agent are added thereto.

In addition, a paste obtained after dispersing and mixing by the ball mill is further dispersed by a three-roll mill to obtain a conductive carbon paste.

Ethyl acetoacetate block body (solid content 80 wt %, NCO content 10 wt %) Coronate 2513, which is obtained by blocking an isocyanate group of hexamethylenediisocyanate-based polyisocyanate of aliphatic polyfunctional isocyanate by ethyl acetoacetate and by diluting it with a solvent of cellosolve acetate and xylene at a rate of 1 to 1, is added to this paste. Then, the paste is mixed sufficiently by a disper and defoamed sufficiently. Thus, a conductive carbon paste is obtained.

Then, the obtained conductive carbon paste is printed into a predetermined pattern by a screen printing method, and after being leveled and dried, the paste is firmly hardened at 150° C. for 30 minutes to form the rear surface electrode layers $D_1$ to $D_{n+1}$ as shown in FIG. 9B.

The respective rear surface electrode layers $D_1$ to $D_{n+1}$ are formed so as to be connected to the transparent electrode layers $T_1$ to $T_n$ through the openings $M_1$ to $M_n$. The openings $M_1$ to $M_n$ are filled with the connection electrode layers $E_1$ to $E_n$. The rear surface electrode layers $D_1$ to $D_{n+1}$ are electrically connected to the transparent electrode layers $T_1$ to $T_n$, respectively, through the connection electrode layers $E_1$ to $E_n$.

Figure 9C:
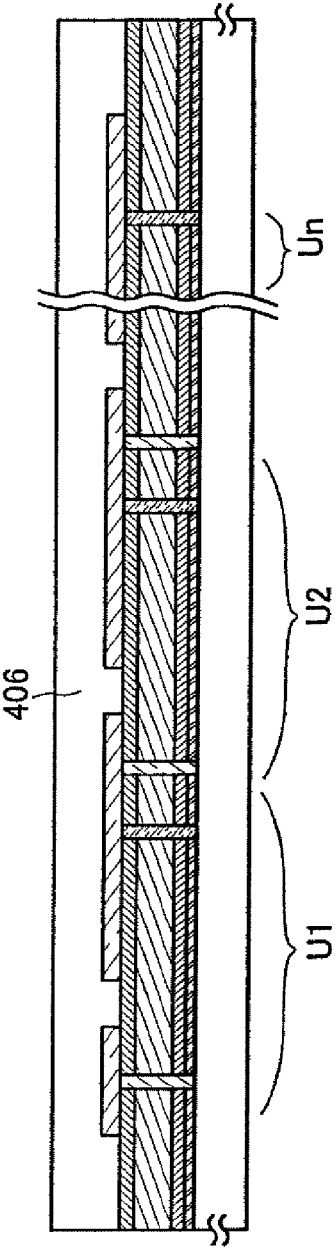

Next, a sealing resin layer 406 is formed by a printing method (refer to FIG. 9C). In this embodiment, an epoxy resin, γ-butyrolactone, isophorone, a defoaming agent, and a leveling agent are prepared as a raw material of a sealing resin.

First, among the above raw materials, the epoxy resin is completely dissolved in a mixture solvent of γ-butyrolactone/isophorone, and is dispersed by a ball mill made of zirconia. Subsequently, the defoaming agent and the leveling agent are further added thereto. The solvent is further mixed, and a butylated melamine resin is added as a thermal cross-linking reactive component.

These are further mixed and dispersed to obtain an composition having a transparent and insulating property for a surface protecting and sealing film.

The sealing resin layer 406 is formed by a screen printing method using the obtained ink composition having a transparent and insulating property for a surface protecting and sealing film and is thermally hardened at 150° C. for 30 minutes. In the sealing resin layer 406, openings are formed over the rear surface electrode layers $D_1$ and $D_{n+1}$ so that the rear surface electrode is connected to an external circuit board through the openings.

As described above, unit cells $U_1$ to $U_n$ having the transparent electrode layers $T_1$ to $T_n$, the photoelectric conversion layers $K_1$ to $K_n$, the connection electrode layers $E_1$ to $E_n$, and the rear surface electrode layers $D_1$ to $D_{n+1}$ are formed over the substrate 401. N pieces of series-connected solar batteries can be manufactured by connecting the adjacent rear surface electrode layers $D_1$ to $D_{n+1}$ to the transparent electrode layers $T_1$ to $T_n$ through the openings $M_1$ to $M_n$. The rear surface electrode layer $D_1$ becomes an extracting electrode of the transparent electrode layer $T_1$ in the unit cell $U_1$ whereas the rear surface electrode layer $D_{n+1}$ becomes an extracting electrode of the transparent electrode layer $T_n$ in the unit cell $U_n$.

Next, an example in which the above solar battery is applied to a wristwatch is explained below.

Figure 10:
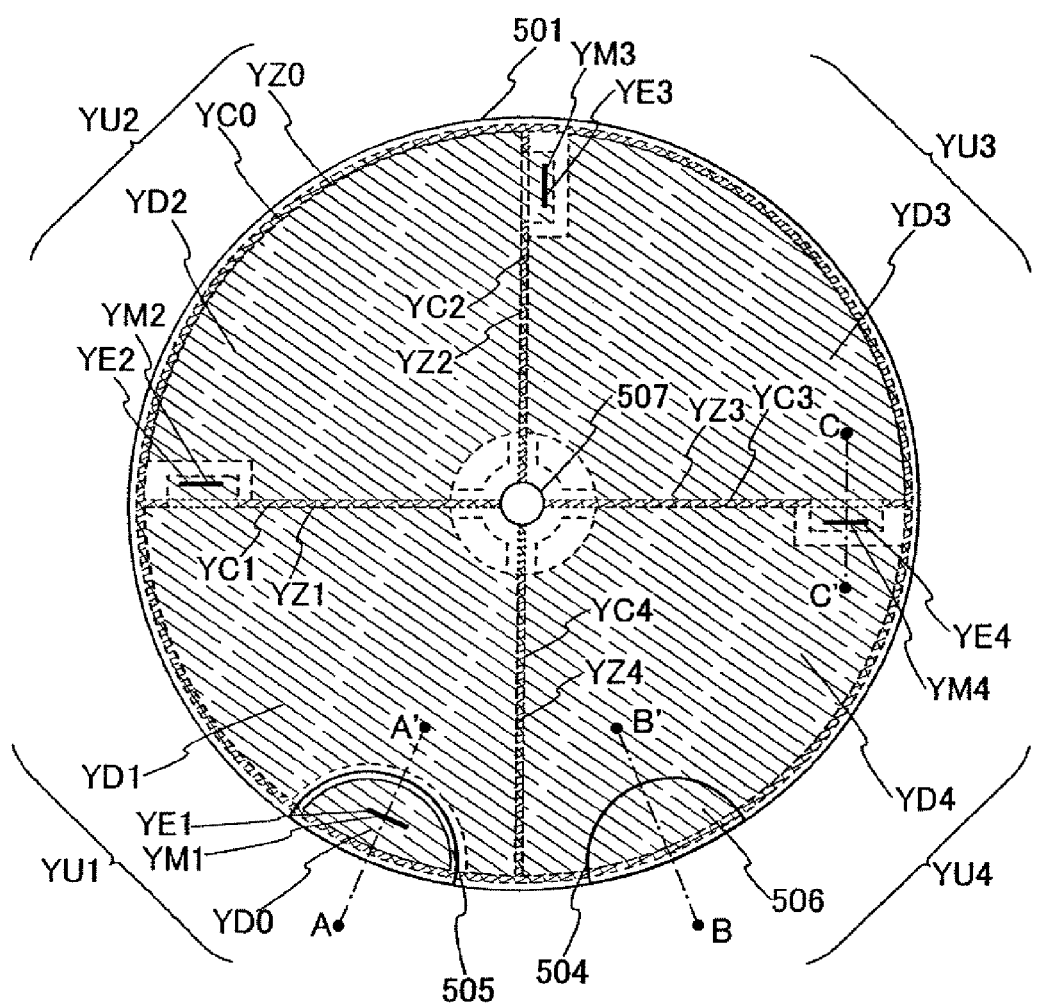
FIG. 10 is a top view of a photoelectric conversion device of the present invention.

FIG. 10 shows a top view in which a solar battery that is applied to a wristwatch is seen from a rear surface electrode side. FIG. 10 shows an example of a wristwatch in which a solar battery is arranged on the lower side (portion where a movement of a wristwatch is incorporated) of a semi-light transmitting dial. A substrate 501 is an organic resin film having a thickness of 70 μm. Although any of the organic resin materials described in the explanation of the substrate 401 can be applied, a PEN substrate is typically used for the substrate 501. The shape of the substrate 501 is not limited to a circle. An insertion port 507 of a pointer shaft is provided at the center of the substrate 501.

In the solar battery, a transparent electrode layer, a photoelectric conversion layer, a rear surface electrode layer, and a sealing resin layer are sequentially stacked over the substrate 501. Although four unit cells $YU_1$ to $YU_4$ are concentrically arranged over the substrate 501 in FIG. 10, the structure of series connection of the solar battery is basically the same as that of FIG. 9C.

In FIG. 10, the unit cells $YU_1$ to $YU_4$ are defined by an opening $YC_0$ formed in a transparent electrode layer and a photoelectric conversion layer, and by openings $YC_1$ to $YC_4$ inside the opening $YC_0$. The openings $YC_0$ to $YC_4$ are filled with insulating resin layers $YZ_0$ to $YZ_4$.

Connection electrodes $YE_1$ to $YE_4$ are formed by an ink jet method using a metal paste such as a silver (Ag) paste in the photoelectric conversion layer and the transparent electrode layer. Rear surface electrode layers $YD_1$ to $YD_4$ are respectively connected to transparent electrode layers $YT_2$ to $YT_4$ of the adjacent unit cells $YU_1$ to $YU_4$ through the connection electrode layers $YE_1$ to $YE_4$ formed in the openings $YM_2$ to $YM_4$. A sealing resin layer 504 is formed over the entire surface of the rear surface electrodes except for connection portions 505 and 506 that are connected to a circuit board of the wristwatch. An output electrode $YD_0$ of the transparent electrode is formed at the connection portion 505 that is connected to the circuit board, and the output electrode $YD_0$ is connected to the transparent electrode through an opening $YM_1$. As shown in FIG. 10, the output electrode $YD_0$ is formed to be separated from the rear surface electrode layer $YD_1$. The rear surface electrode layer $YD_4$, which is the other connection portion 506, also serves as an output electrode.

Figure 11A:
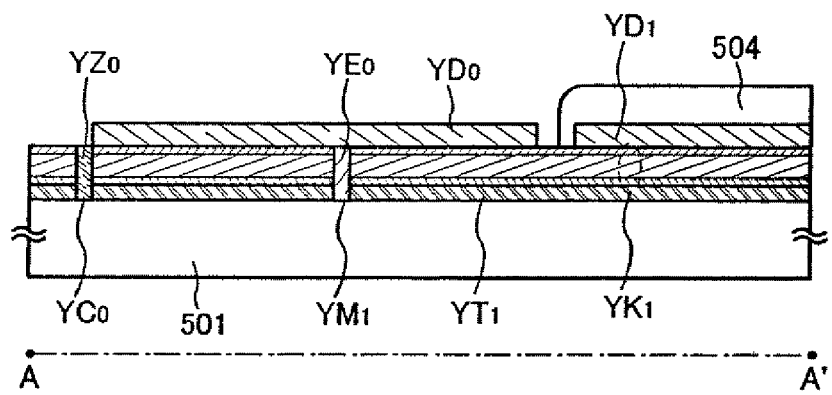
FIGS. 11A to 11C are cross-sectional views of a photoelectric conversion device of the present invention.

FIG. 11A shows a cross-sectional view taken along a line A-A' of the periphery of the connection portion 505 that is connected to the circuit board in FIG. 10. The transparent electrode layer, the photoelectric conversion layer, and the rear surface electrode layer are formed over the substrate 501. The openings $YC_0$ and $YM_1$ are formed by a laser processing method in the transparent electrode layer and the photoelectric conversion layer, and the insulating layer $YZ_0$ is formed in the opening $YC_0$ to fill the opening. The output electrode $YD_0$ on the transparent electrode side is connected to the transparent electrode layer $YT_1$ of the unit cell $YU_1$ through a connection electrode $YE_0$ formed in the opening $YM_1$. The sealing resin layer 504 is formed over the rear surface electrode layer $YD_1$ of the unit cell $YU_1$.

Figure 11B:
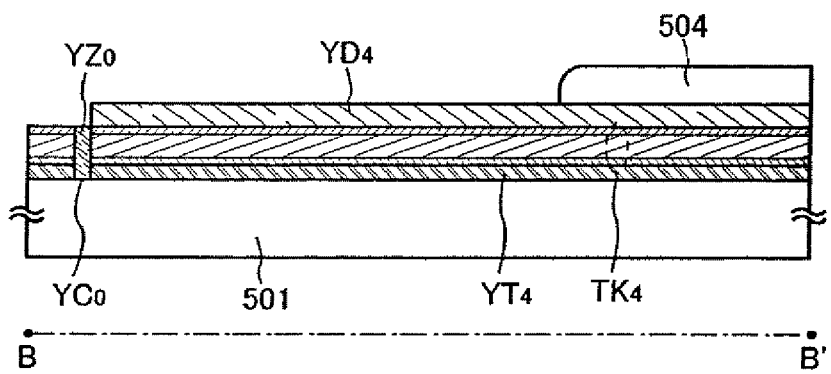

Similarly, FIG. 11B shows a cross-sectional view taken along a line B-B' of the periphery of the connection portion 506 that is connected to an external circuit. The transparent electrode layer $YT_4$, a photoelectric conversion layer $YK_4$, and the rear surface electrode layer $YD_4$ are formed over the substrate 501. The transparent electrode layer $YT_4$ is formed inside the edge by the opening $YC_0$. The insulating layer $YZ_0$ fills the opening. Although the sealing resin layer is formed over the rear surface electrode layer $YD_4$, it is not formed over the connection portion 506.

Figure 11C:
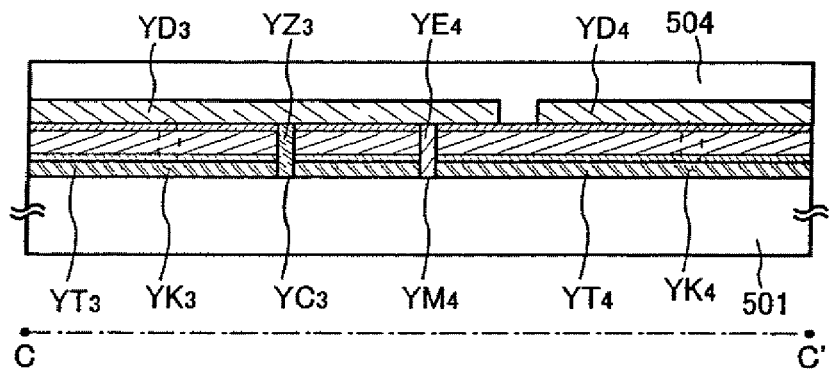

FIG. 11C shows a cross-sectional view taken along a line C-C' of the periphery of the connection portion of the adjacent unit cells in FIG. 10. The transparent electrode layers $YT_3$ and $YT_4$ are formed over the substrate 501, and are electrically isolated from each other by the insulating layer $YZ_3$ formed in the opening $YC_3$. Similarly, the photoelectric conversion layers $YK_3$ and $YK_4$ are also isolated. The rear surface electrode layer $YD_3$ is connected to the transparent electrode layer $YT_4$ through the connection electrode layer $YE_4$ formed in the opening $YM_4$, whereby the unit cells $YU_3$ and $YU_4$ are connected.

Figure 12:
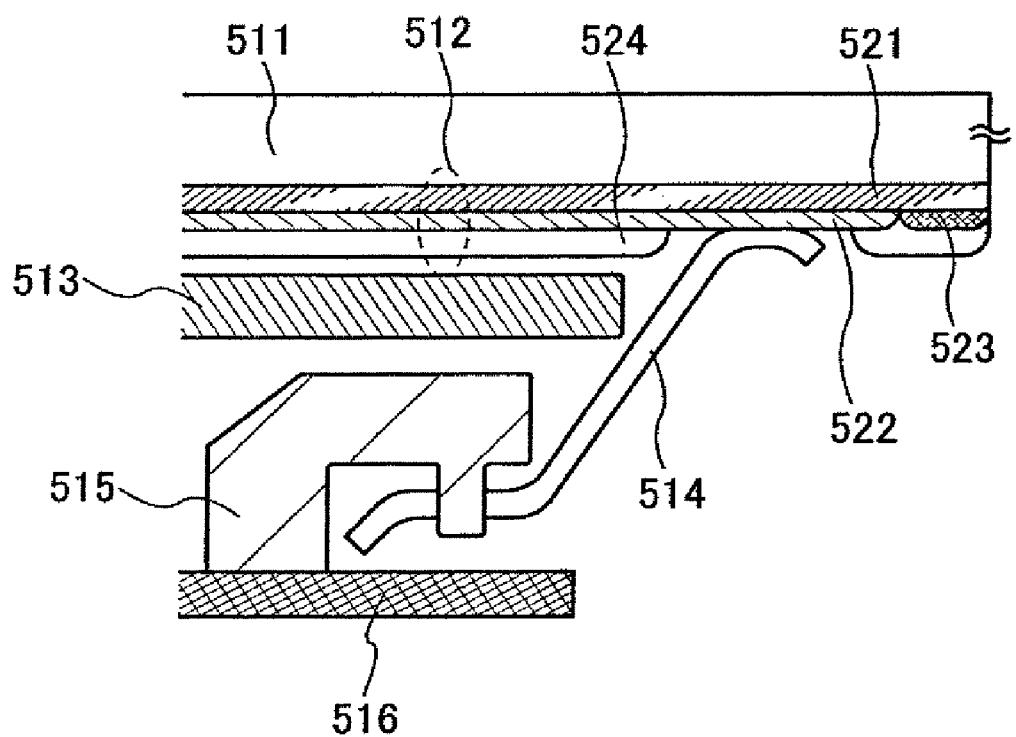
FIG. 12 is a cross-sectional view of a photoelectric conversion device of the present invention.

As described above, it is possible to form the solar battery in which the four unit cells $YU_1$ to $YU_4$ are connected in series. In solar batteries incorporated in various electric devices such as a calculator or a watch, there is an adopted method of direct connection using a coil spring or a plate spring, in addition to a connecting method using soldering or a thermosetting adhesive agent to connect a solar battery to a circuit in the electric device. FIG. 12 is a view for explaining an example of such a connection method where connection between a photoelectric conversion device 512 and a circuit board 516 is made through a connection spring 514. The structure of the photoelectric conversion device 512 is simply shown, and a rear surface electrode 522, an insulating resin 523, and a sealing resin 524 that are formed over a substrate 521 is shown. In addition, a stainless steel structural body 513, a support body 511, and the like are also included. The connection spring 514 is in contact with the rear surface electrode 522 in an opening portion of the sealing resin 524, and electrical connection to the circuit board 516 is formed through a terminal portion 515. A connection structure of a contact by applying pressure using mechanical force like this does not give severe damage to a solar battery compared with a connection method such as soldering or heat sealing, and does not cause a yield to be reduced in a manufacturing process.

Figure 13A:
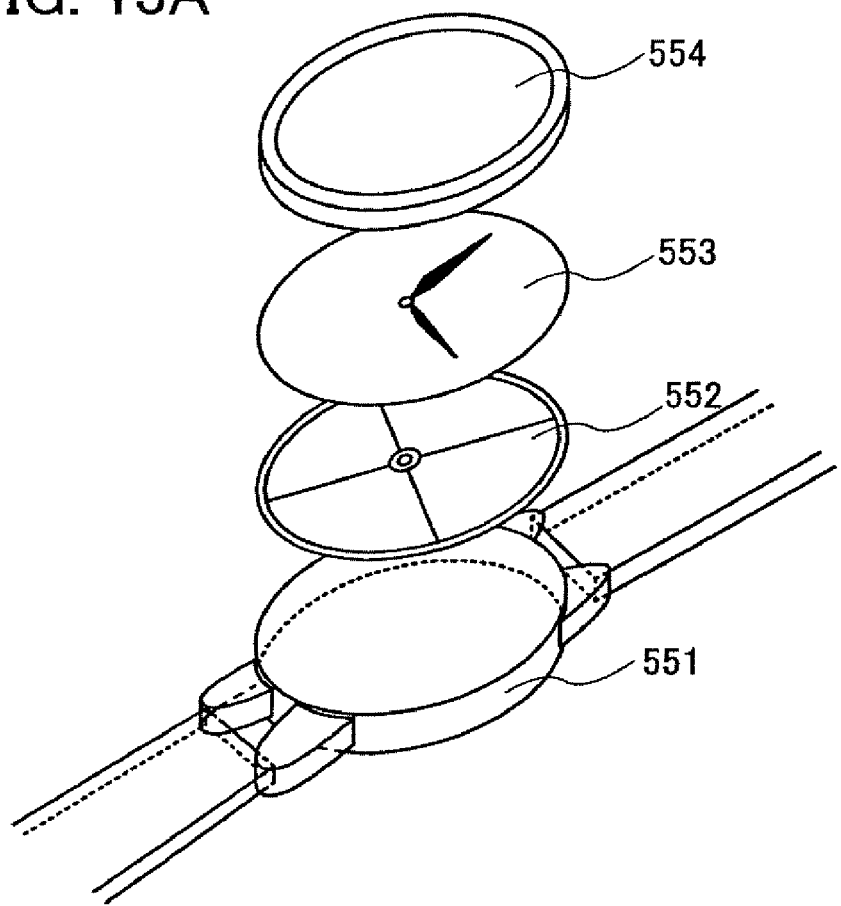
FIGS. 13A and 13B are views showing a device on which a photoelectric conversion device of the present invention is mounted.

FIG. 13A shows a wristwatch in which a solar battery formed as described above is incorporated. In FIG. 13A, reference numeral 551 denotes a chassis; 552, the solar battery shown in FIG. 10 and FIGS. 11A to 11C; 553, a dial having a long hand and a short hand; and 554, a cover.

Figure 13B:
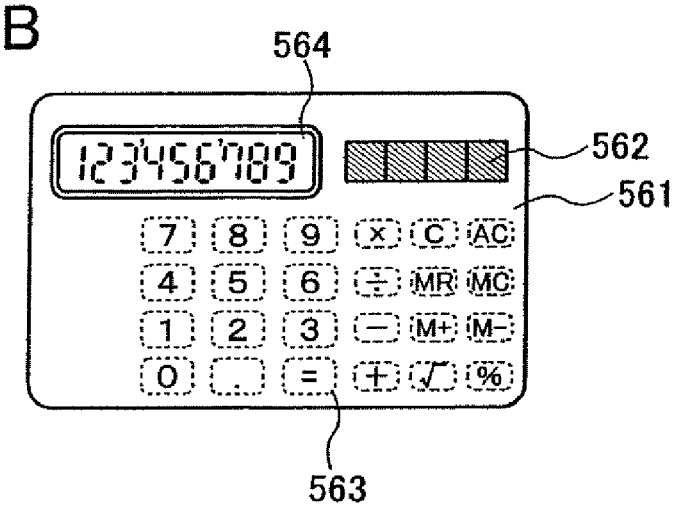

Further, FIG. 13B shows a calculator in which the solar battery manufactured by the present invention is incorporated. In FIG. 13B, reference numeral 561 denotes a chassis; 562, a solar battery; 563, buttons; and 564, a display panel. As the solar battery 562, a solar battery in which unit cells are connected in series as shown in FIG. 9C may be used.

It is to be noted that this embodiment can be combined with any description in Embodiment Modes 1 and 2.

Embodiment 2

In this embodiment, an example of manufacturing a photosensor will be explained with reference to FIGS. 14A and 14B, FIGS. 15A to 15C, FIGS. 16A and 16B, FIGS. 17A and 17B, FIG. 18, FIGS. 19A to 19D, FIGS. 20A to 20D, FIG. 24, FIG. 25, and FIG. 26.

Figure 14A:
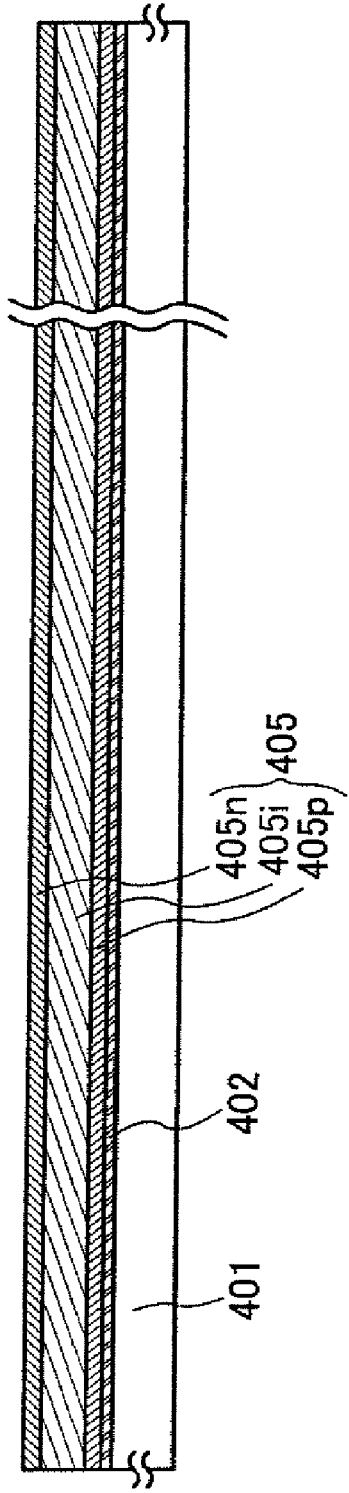
FIGS. 14A and 14B are views showing a process for manufacturing a photoelectric conversion device of the present invention.

First, processes to forming the photoelectric conversion layer 405 shown in FIG. 8B are performed, which is based on Embodiment 1 (refer to FIG. 14A). It is to be noted that the same portions as Embodiment 1 are denoted by the same reference numeral, and the processes, materials, and the like shown in Embodiment 1 are adopted here in a case where they are not particularly mentioned.

Figure 14B:
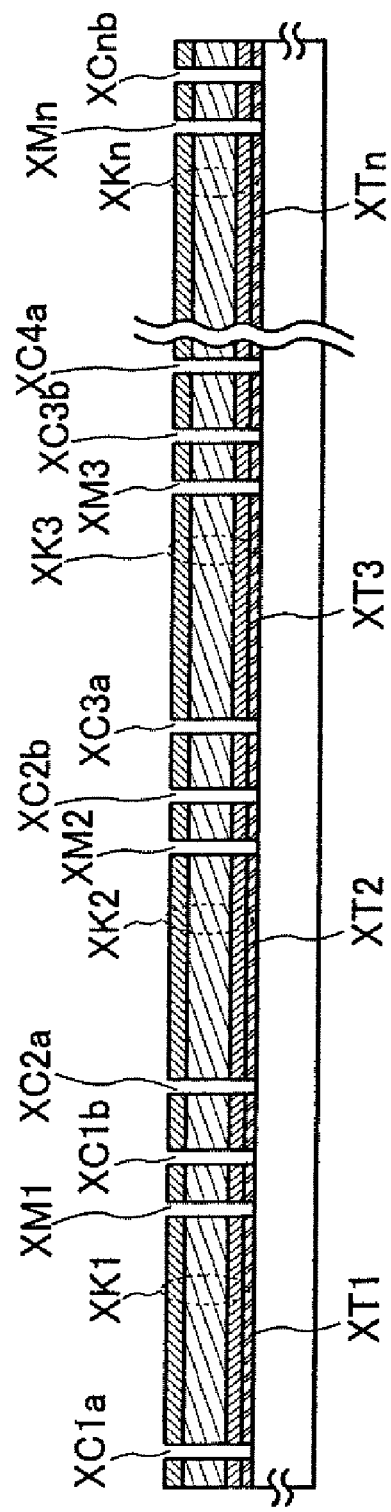

Next, openings $XM_1$ to $XM_n$, $XC_{1a}$ to $XC_{na}$, and $XC_{1b}$ to $XC_{nb}$ are formed in the photoelectric conversion layer 405 by a laser processing method (laser scribe) (refer to FIG. 14B). It is to be noted that, in FIG. 14B, the openings $XM_1$ to $XM_n$, $XC_{1a}$ to $XC_{na}$, and $XC_{1b}$ to $XC_{nb}$ reach the substrate 401. However, the openings $XM_1$ to $XM_n$ may be formed so that transparent electrode layers $XT_1$ to $XT_n$ can be electrically connected to connection electrode layers $XE_{1b}$ to $XE_{nb}$ in the subsequent process. In other words, the openings $XM_1$ to $XM_n$ may be formed so as to reach the substrate 401 or so as to reach the transparent electrode layer 402. Further, the openings $XC_{1a}$ to $XC_{na}$ and $XC_{1b}$ to $XC_{nb}$ may be formed so as to electrically isolate an element in the subsequent process.

The openings $XC_{1a}$ to $XC_{na}$ and $XC_{1b}$ to $XC_{nb}$ are openings for electrically isolation, which are provided to form unit cells $XU_1$ to $XU_n$. The unit cell $XU_i$ (i=1, 2, . . . , n) includes the openings $XC_{ia}$ and $XC_{ib}$. Further, the openings $XM_1$ to $XM_n$ openings for forming connection of a transparent electrode layer and an electrode layer.

By forming the openings $XM_1$ to $XM_n$, $XC_{1a}$ to $XC_{na}$, and $XC_{1b}$ to $XC_{nb}$, the transparent electrode layer 402 is divided into $XT_1$ to $XT_n$, and the photoelectric conversion layer 405 is divided into $XK_1$ to $XK_n$.

Figure 15A:
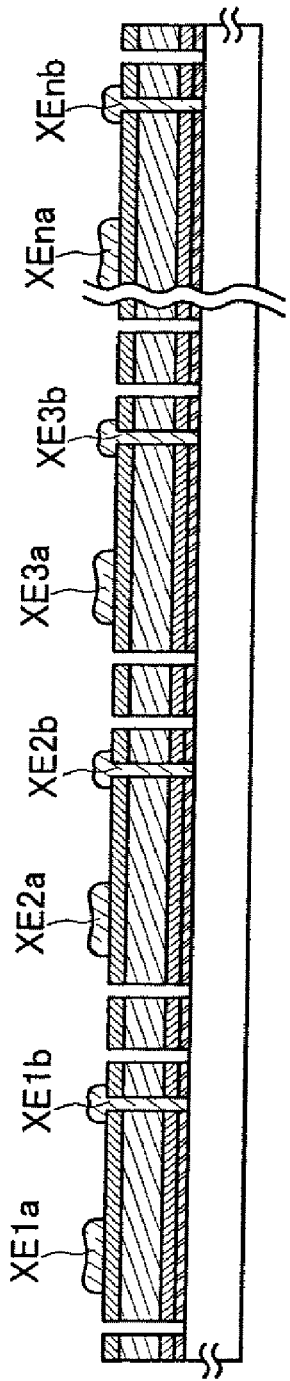
FIGS. 15A to 15C are views showing a process for manufacturing a photoelectric conversion device of the present invention.

Subsequently, the openings $XM_1$ to $XM_n$ are filled with a conductive paste by an ink jet method, a screen printing method, or the like to form the connection electrode layers $XE_{1b}$ to $XE_{nb}$ as shown in FIG. 15A. In addition, connection electrode layers $XE_{1a}$ to $XE_{na}$ are formed over a top layer of the photoelectric conversion layer 405, which is the n-type semiconductor layer 405n in this embodiment. As a material for the connection electrode layers $XE_{1a}$ to $XE_{na}$ and $XE_{1b}$ to $XE_{nb}$, the same material as the connection electrode layers $E_1$ to $E_n$ described in Embodiment 1 may be used.

Figure 15B:
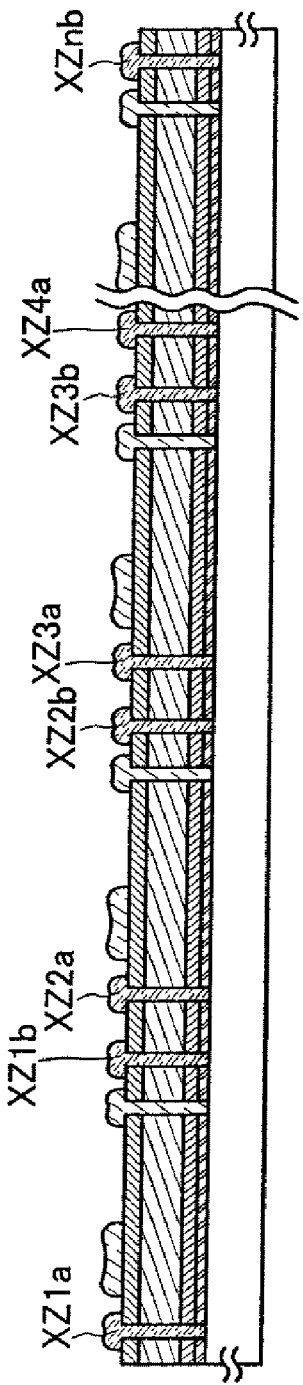
Figure 15C:
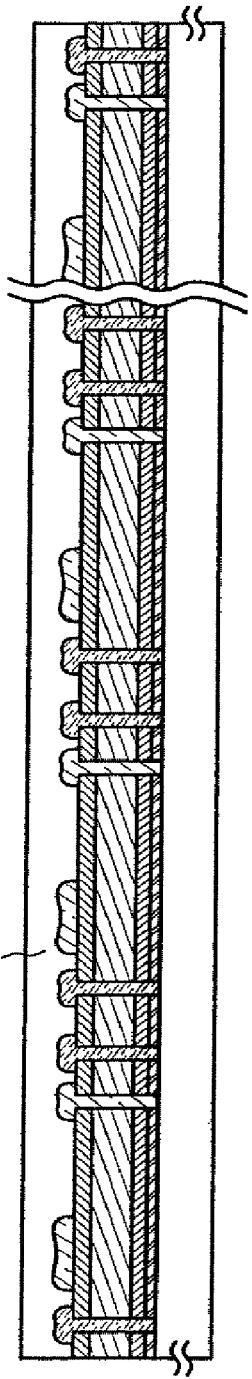

Next, the openings $XC_{1a}$ to $XC_{na}$ and $XC_{1b}$ to $XC_{nb}$ are filled with insulating resin layers $XZ_{1a}$ to $XZ_{na}$ and $XZ_{1b}$, to $XZ_{nb}$ to electrically isolate an element (refer to FIG. 15B). The insulating resin layers $XZ_{1a}$ to $XZ_{na}$ and $XZ_{1b}$ to $XZ_{nb}$ may be formed by the same process as that of the insulating resin layers $Z_1$ to $Z_n$ described in Embodiment 1.

In this embodiment, the connection electrode layers $XE_{1a}$ to $XE_{na}$ and $XE_{1b}$ to $XE_{nb}$ are formed first. However, either the connection electrode layers $XE_{1a}$ to $XE_{na}$ and $XE_{1b}$ to $XE_{nb}$, or the insulating resin layers $XZ_{1a}$ to $XZ_{na}$ and $XZ_{1b}$ to $XZ_{nb}$ may be first formed.

Next, an insulating layer 601 is formed. The insulating layer 601 may be formed by the same process, material, and the like as those of the sealing resin layer 406 in Embodiment 1.

Figure 16A:
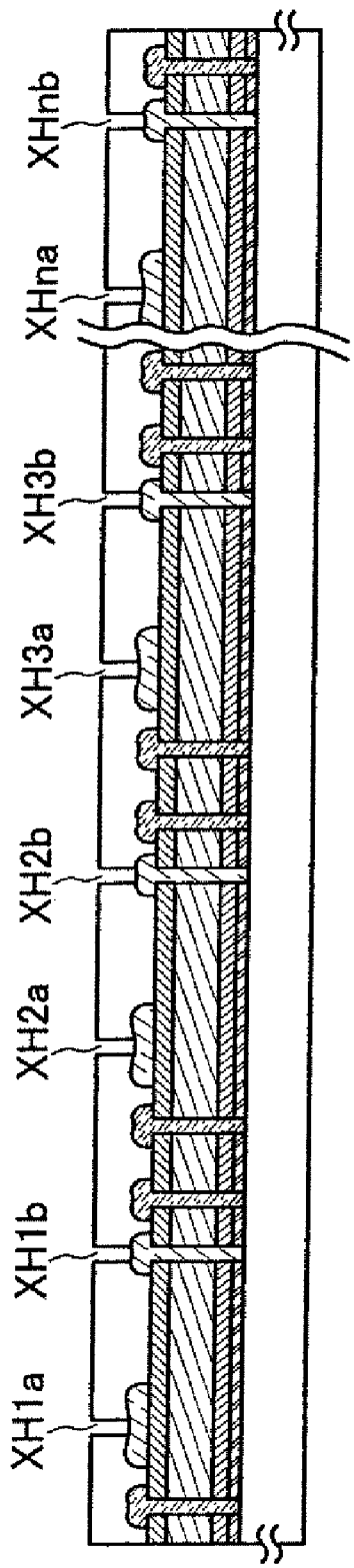
FIGS. 16A and 16B are views showing a process for manufacturing a photoelectric conversion device of the present invention.
Figure 16B:
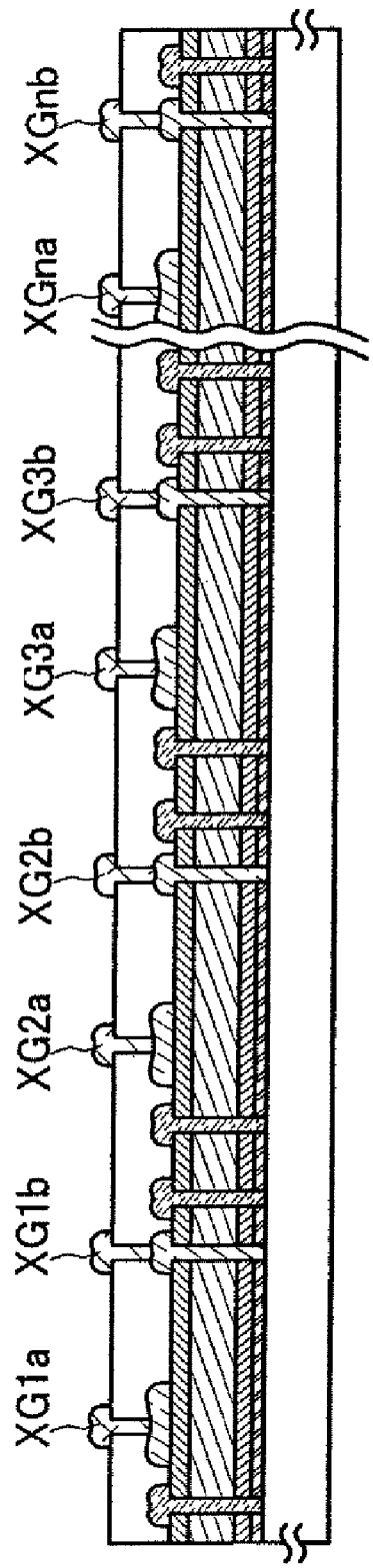

Then, openings $XH_{1a}$ to $XH_{1n}$ and $XH_{1b}$ to $XH_{nb}$ are formed in the insulating layer 601 by a laser processing method (laser scribe) (refer to FIG. 16A). The opening $XH_{ia}$ (i=1, 2, . . . , n) is formed so as to reach the connection electrode layer $XE_{ia}$, and the opening $XH_{ib}$, is formed so as to reach a connection electrode layer $XE_{ib}$.

In addition, the openings to $XH_{1a}$ to $XH_{1n}$ and $XH_{1b}$ to $XH_{nb}$ are filled to form electrode layers $XG_{1a}$ to $XG_{na}$ and $XG_{1b}$ to $XG_{nb}$ with the same material as the connection electrode layers $XE_{1a}$ to $XE_{na}$ and $XE_{1b}$ to $XE_{nb}$. The electrode layer $XG_{ia}$ (i=1, 2, . . . , n) is connected to the connection electrode layer $XE_{ia}$ through the opening $XH_{ia}$, and the electrode layer $XG_{ib}$ is connected to the connection electrode layer $XE_{ib}$ through the opening $XH_{ib}$.

Subsequently, the substrate 401, the transparent electrode layers $XT_1$ to $XT_n$, the photoelectric conversion layers $XK_1$ to $XK_n$, the connection electrode layers $XE_{1a}$ to $XE_{na}$ and $XE_{1b}$ to $XE_{nb}$, the insulating resin layers $XZ_{1a}$ to $XZ_{na}$ and $XZ_{1b}$ to $XZ_{nb}$, the insulating layer 601, and the electrode layers $XG_{1a}$ to $XG_{na}$ and $XG_{1b}$ to $XG_{nb}$ are each divided into unit cells $XU_1$ to $XU_n$ by laser scribe. For division into the unit cells $XU_1$ to $XU_n$, regions between the insulating resin layers $XZ_{1b}$ and $XZ_{2a}$ to between the insulating resin layers $XZ_{(n-1)b}$ and $XZ_{na}$ may be irradiated with a laser beam 603 (refer to FIGS. 17A and 17B).

Figure 18:
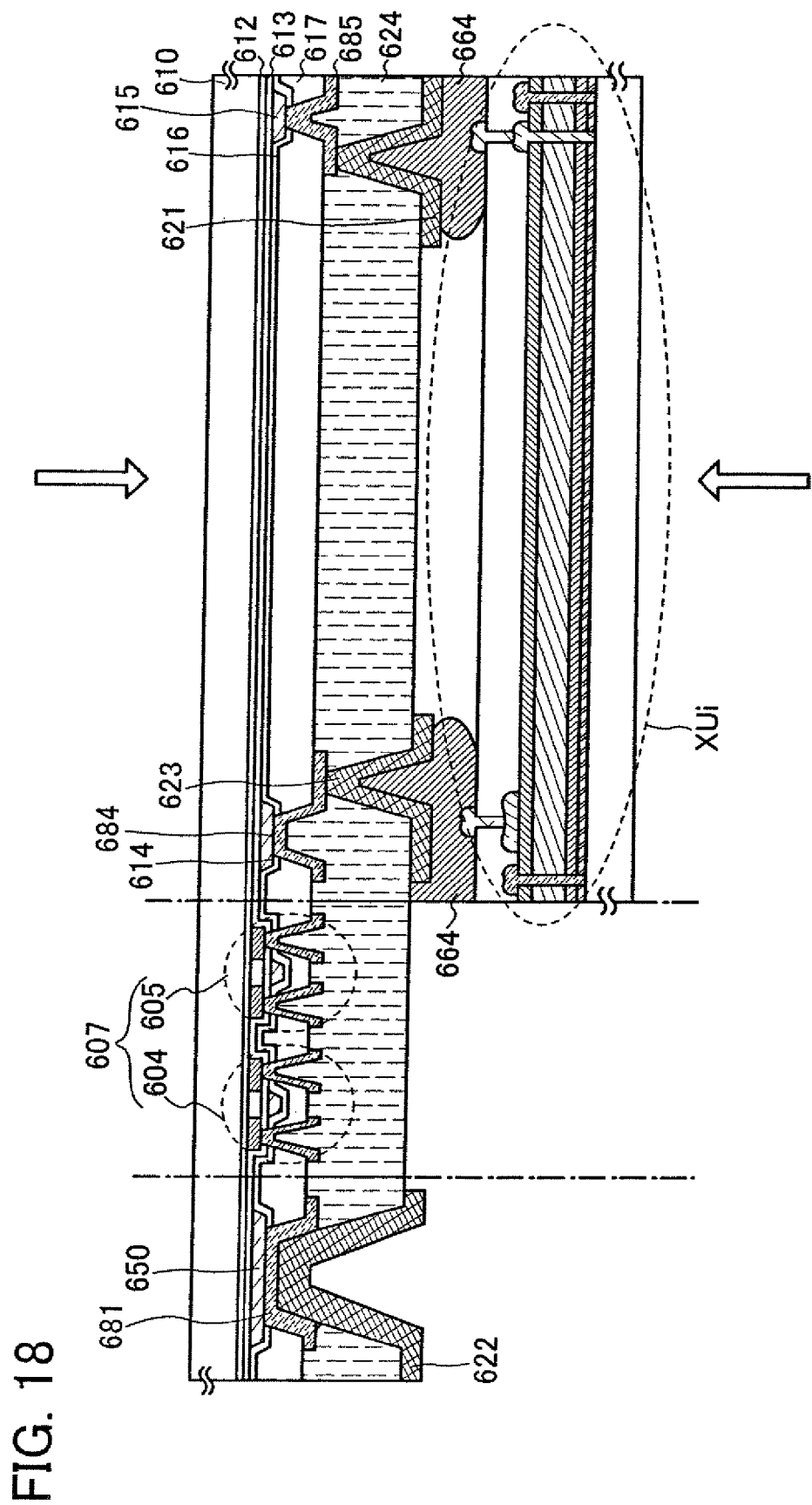
FIG. 18 is a view showing a process for manufacturing a photoelectric conversion device of the present invention.

FIG. 18 shows a mode in which the unit cell $XU_i$ (i=1, 2, ..., n) of a photosensor manufactured as described above is connected to a circuit board provided with an amplifier circuit.

In FIG. 18, reference numeral 610 denotes a substrate; 612, a base insulating film; and 613, a gate insulating film. Since light to be received transmits through the substrate 610, the base insulating film 612, and the gate insulating film 613, materials thereof having a high light transmitting property are desired to be used.

An amplifier circuit, for example, transistors 604 and 605 such as thin film transistors (TFT), which constitutes a current mirror circuit 607, is formed over the base insulating film 612. A wiring 614, a wiring 615, and an electrode 650 are formed over the gate insulating film 613 of the TFTs 604 and 605.

Interlayer insulating films 616 and 617 are formed over the gate insulating film 613, the wiring 614, the wiring 615, and the electrode 650. A wiring 684 connected to the wiring 614, an electrode 685 connected to the wiring 615, and an electrode 681 connected to the electrode 650 are formed over the interlayer insulating film 617.

In addition, a sealing layer 624 is formed over the interlayer insulating film 617, the TFTs 604 and 605, the wiring 684, the electrode 685, and the electrode 681. Further, an electrode 623 connected to the wiring 684, an electrode 621 connected to the electrode 685, and an electrode 622 connected to the electrode 681 are formed over the sealing layer 624.

The circuit board formed as described above and the unit cell $XU_i$ are attached to each other. Therefore, the electrode 623 and the electrode layer $XG_{ia}$, and the electrode 621 and the electrode layer $XG_{ib}$ are electrically connected to each other through a conductor 664, for example, a conductive paste.

As the conductive paste, a conductive paste including a metal material such as silver (Ag), gold (Au), copper (Cu), or nickel (Ni), or a conductive carbon paste can be used. In this embodiment, the conductor 664 is formed using a silver (Ag) paste.

In FIG. 18, light enters the photoelectric conversion layer $XK_i$ from a substrate 610 side and a substrate 401 side of the unit cell $XU_i$ as shown by arrows in the view. Thus, a light current is generated, and light can be detected.

However, light may enter the photoelectric conversion layer from only the substrate 610 side or only the substrate 401 side as needed. When light enter the photoelectric conversion layer from one of the substrate 610 side and the substrate 401 side, a material that does not transmit light may used for the substrate of the other side or the substrate of the other side may be covered with the material that does not transmit light.

Next, a process for manufacturing a circuit board will be explained below with reference to FIGS. 19A to 19D, and FIGS. 20A to 20D.

First, an element is formed over the substrate 610. In this embodiment, AN 100 produced by Asahi Glass CO., LTD, which is one of glass substrates, is used as the substrate 610.

Subsequently, a silicon oxide film containing nitrogen (with a film thickness of 100 nm) to be the base insulating film 612 is formed by a plasma CVD method, and a semiconductor film such as an amorphous silicon film containing hydrogen (with a film thickness of 54 nm) is stacked without being exposed to an atmospheric air. Further, the base insulating film 612 may be formed by stacking a silicon oxide film, a silicon nitride film, and a silicon oxide film containing nitrogen. For example, a film in which a silicon nitride film containing oxygen with a film thickness of 50 nm and a silicon oxide film containing nitrogen with a film thickness of 100 nm are stacked may be formed as the base insulating film 612. It is to be noted that the silicon oxide film containing nitrogen and the silicon nitride film serve as a blocking layer that prevents an impurity such as an alkali metal from diffusing from the glass substrate.

Then, the amorphous silicon film is crystallized by a solid-phase growth method, a laser crystallization method, a crystallization method using a catalyst metal, or the like to form a semiconductor film having a crystalline structure (a crystalline semiconductor film), for example, a polycrystalline silicon film. Here, a polycrystalline silicon film is obtained by a crystallization method using a catalyst element. A solution containing nickel of 10 ppm by weight is added to the amorphous silicon film by a spinner. It is to be noted that a nickel element may be dispersed over the entire surface by a sputtering method instead of adding the solution. Then, heat treatment is performed for crystallization to form a semiconductor film having a crystalline structure (here, a polycrystalline silicon film). Here, a polycrystalline silicon film is obtained by heat treatment for crystallization (at 550° C. for 4 hours) after the heat treatment (at 500° C. for one hour).

Next, an oxide film over the surface of the polycrystalline silicon film is removed by a dilute hydrofluoric acid or the like. Thereafter, irradiation of a laser beam for raising a degree of crystallization and repairing a defect left in a crystal grain is performed.

It is to be noted that the following laser irradiation method may be employed in a case where a crystalline semiconductor film is obtained by crystallizing the amorphous silicon film by a laser crystallization method or in a case where laser irradiation is performed to repair a defect left in a crystal grain after obtaining a semiconductor film having a crystalline structure.

A continuous wave laser beam (CW laser beam) or a pulsed wave laser beam (pulsed laser beam) can be used for the laser irradiation. As the laser beam that can be used here, one or more of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser, can be used. A crystal with a large grain size can be obtained by irradiation of a laser beam having a fundamental wave of such lasers or second, third, and fourth harmonic of the fundamental wave. For example, the second harmonic (532 nm) or the third harmonic (355 nm) of an $Nd:YVO_4$ laser (fundamental wave of 1064 nm) can be used. In this case, energy density of approximately 0.01 to 100 $MW/cm^2$ (preferably, 0.1 to 10 $MW/cm^2$) is required for a laser. The scanning speed is set to be approximately 10 to 2000 cm/sec for the irradiation.

It is to be noted that a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta as a dopant is added; an Ar ion laser; a Kr ion laser; or a Ti:sapphire laser can be continuously oscillated. Further, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse while the semiconductor film is melted by the laser beam and solidified. Therefore, differing from a case of using a pulsed laser with a low oscillation frequency, a solid-liquid interface can be continuously moved in the semiconductor film, so that crystal grains that continuously grow toward a scanning direction can be obtained.

When ceramic (polycrystalline) is used as a medium, the medium can be formed to have a free shape in a short time at low cost. When a single crystal is used, a columnar medium with several mm in diameter and several tens of mm in length is usually used. In a case of using the ceramic, a medium larger than the case of using the single crystal can be formed.

A concentration of a dopant such as Nd or Yb in a medium, which directly contributes to light emission, cannot be changed largely in both cases of the single crystal and the poly crystal; therefore, there is a limitation to some extent in improvement in output of a laser by increasing the concentration. However, in the case of the ceramic, the size of a medium can be significantly increased as compared to the case of the single crystal; therefore, drastic improvement in output of a laser can be expected.

Further, in the case of the ceramic, a medium with a parallelepiped shape or a cuboid shape can be easily formed. In a case of using a medium having such a shape, when oscillated light is made to travel in a zigzag inside the medium, a long path of the oscillated light can be obtained. Therefore, amplitude is increased and a laser beam can be oscillated at high output. Furthermore, a cross-sectional shape of a laser beam, which is emitted from a medium having such a shape, is a quadrangular shape; therefore, as compared to a laser beam with a circular shape, the laser beam with the quadrangular shape in cross section has an advantage to be shaped into a linear beam. By shaping a laser beam emitted in such a manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction.

When a semiconductor film is irradiated with such a linear beam, an entire surface of the semiconductor film can be uniformly annealed. In a case where uniform annealing is required from one edge to the other edge of the linear beam, an ingenuity in which slits are arranged on the both edges of the linear beam so as to shield a portion with attenuated energy from light, or the like is required.

In a case where laser irradiation is performed in an atmospheric air or an oxide atmosphere, an oxide film is formed over a surface of the semiconductor film by the laser irradiation.

Then, in addition to the oxide film formed by the laser beam irradiation, a barrier layer made of an oxide film having a thickness of 1 to 5 nm in total is formed by treating a surface with ozone water for 120 seconds. The barrier layer is formed in order to remove a catalyst element, which is added for crystallization, such as nickel (Ni) from the film. Although the barrier layer is formed by using ozone water here, a barrier layer may also be formed by a method of oxidizing a surface of a semiconductor film having a crystalline structure by UV-ray irradiation in an oxygen atmosphere; a method of oxidizing a surface of a semiconductor film having a crystalline structure by oxygen plasma treatment; by a method of depositing an oxide film having a thickness of approximately 1 to 10 nm using a plasma CVD method, a sputtering method, an evaporation method, or the like. In addition, before forming the barrier layer, the oxide film formed by laser beam irradiation may be removed.

Subsequently, over the barrier layer, an amorphous silicon film containing an argon element is formed to have a thickness of 10 nm to 400 nm, for example 100 nm here, by a sputtering method to serve as a gettering site. Here, the amorphous silicon film containing an argon element is formed in an atmospheric air containing argon using a silicon target. When a plasma CVD method is used to form the amorphous silicon film containing an argon element, the film formation condition is as follows: a flow ratio of monosilane to argon ($SiH_4$:Ar) is set to be 1:99; film formation pressure is set to be 6.665 Pa; RF power density is set to be 0.087 W/cm$^2$; and a film formation temperature is set to be 350° C.

Thereafter, a furnace heated to 650° C. is used for heat treatment for three minutes to remove a catalyst element (gettering). By this treatment, a catalyst element concentration in the semiconductor film having a crystalline structure is reduced. A lamp annealing apparatus may also be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. It is to be noted that there is a tendency that nickel easily moves to a region with a high oxygen concentration in gettering, and thus, it is desirable that the barrier layer made of the oxide film be removed after gettering.

It is to be noted that, in a case where crystallization of a semiconductor film using a catalytic element is not performed, the above described processes such as the formation of the barrier layer, the formation of the gettering site, the heat treatment for gettering, the removal of the gettering site, and the removal of the barrier layer are not required.

Figure 19A:
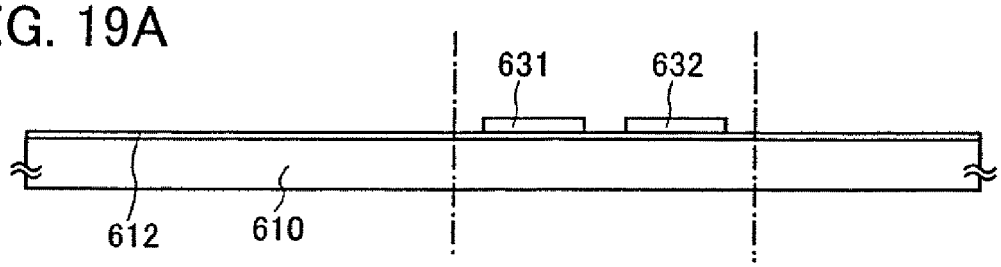
FIGS. 19A to 19D are views showing a process for manufacturing a photoelectric conversion device of the present invention.

Next, after a thin oxide film is formed with ozone water over the surface of the obtained semiconductor film having a crystalline structure (such as a crystalline silicon film), a mask made of resist is formed by using a first photomask, and etching treatment is performed to obtain a desired shape, thereby forming semiconductor films 631 and 632 separated in island shapes (referred to as "island-shape semiconductor regions" in the present specification) (refer to FIG. 19A). After forming the island-shape semiconductor regions, the mask made of resist is removed.

Subsequently, if necessary, doping of the minute amount of an impurity element (boron or phosphorus) is performed to control a threshold value of a TFT. Here, an ion doping method is used, in which diborane ($B_2H_6$) is not separated by mass but excited by plasma.

Next, the oxide film is removed by using an etchant containing hydrofluoric acid at the same time as surfaces of the island-shape semiconductor regions 631 and 632 are washed. Thereafter, an insulating film containing silicon as its main component, which serves as a gate insulating film 613, is formed. Here, a silicon oxide film containing nitrogen (composition ratio: Si=32%, O=59%, N=7%, H=2%) is formed to have a thickness of 115 nm by a plasma CVD method.

Figure 19B:
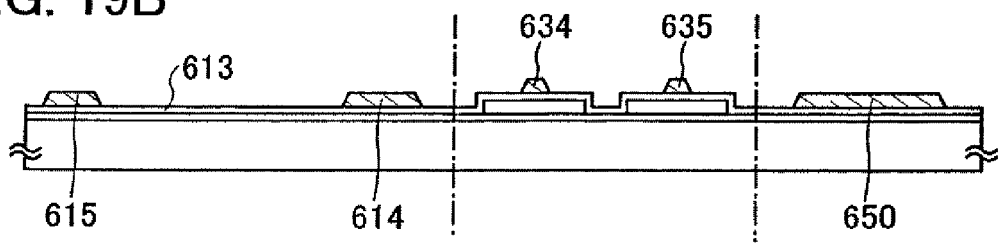
Figure 19C:
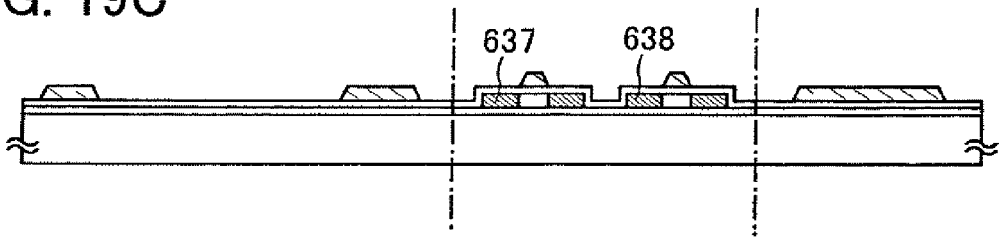

Then, after a metal film is formed over the gate insulating film 613, a second photomask is used to form gate electrodes 634 and 635, wirings 614 and 615, and an electrode 650 (refer to FIG. 19B). For example, as the metal film, a film in which tantalum nitride (TaN) and tungsten (W) are stacked to be 30 nm and 370 nm, respectively, is used.

In addition to the above materials, as the gate electrodes 634 and 635, the wirings 614 and 615, and the electrode 650, a single-layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing the above element as its main component; or a single-layer film made of nitride thereof such as titanium nitride, tungsten nitride, tantalum nitride, or molybdenum nitride can be used.

The wiring 614 extends to an upper side of a channel formation region in the TFT 605 of the amplifier circuit to also serve as the gate electrode 634.

The wiring 615 is connected to a drain electrode (also referred to as a drain wiring) or a source electrode (also referred to as a source wiring) in the TFT 604.

Then, an impurity imparting one conductivity type is introduced to the island-shape semiconductor regions 631 and 632 to form a source region or a drain region 637 of the TFT 605, and a source region or a drain region 638 of the TFT 604. An n-channel TFT is formed in this embodiment; therefore, an n-type impurity, for example phosphorus (P) or arsenic (As), is introduced to the island-shape semiconductor regions 631 and 632 (refer to FIG. 19C).

Subsequently, after a first interlayer insulating film including a silicon oxide film (not shown) is formed to have a thickness of 50 nm by a CVD method, a process for activation treatment of an impurity element added to each island-shape semiconductor region is performed. The activation process is performed by a rapid thermal annealing method (RTA method) using a lamp light source, a method of irradiation of a YAG laser or an excimer laser from a rear surface, heat treatment using a furnace, or a method that is a combination of any of the foregoing methods.

Next, a second interlayer insulating film 616 including a silicon nitride film that contains hydrogen and oxygen is formed to have a film thickness of, for example, 10 nm.

Subsequently, a third interlayer insulating film 617 made of an insulating material is formed over the second interlayer insulating film 616 (refer to FIG. 19D). As for the third interlayer insulating film 617, an insulating film obtained by a CVD method can be used. In order to improve adhesiveness, a silicon oxide film containing nitrogen with a film thickness of 900 nm is formed as the third interlayer insulating film 617 in this embodiment.

Then, heat treatment (at 300 to 550° C. for 1 to 12 hours, for example, at 410° C. in an nitrogen atmosphere for one hour) is performed to hydrogenate the island-shape semiconductor films. This process is performed so as to terminate a dangling bond of the island-shape semiconductor films by hydrogen contained in the second interlayer insulating film 616. The island-shape semiconductor films can be hydrogenated regardless of whether or not the gate insulating film 613 is formed.

Further, as the third interlayer insulating film 617, an insulating film using siloxane or a stacked structure thereof can be used.

Siloxane is formed of a skeleton structure of a bond of silicon (Si) and oxygen (O). As a substituent, an organic group containing at least hydrogen (such as an alkyl group or an aromatic hydrocarbon) is used. A fluoro group may also be used as the substituent. Moreover, an organic group containing at least hydrogen and a fluoro group may be used as the substituent.

In a case where an insulating film using siloxane and a stacked structure thereof are used as the third interlayer insulating film 617, heat treatment for hydrogenating the island-shape semiconductor films is performed after forming the second interlayer insulating film 616, and then, the third interlayer insulating film 617 can be formed.

There is an advantage that, by using materials having a highly light transmitting property for all materials of the interlayer insulating films 616 and 617, light can be transmitted through the interlayer insulating films 616 and 617 even when the light enters from the substrate 610. It is to be noted that a silicon oxide film formed by a CVD method may be used for the interlayer insulating film 617 other than the insulating film using siloxane. When the interlayer insulating film 617 is made of a silicon oxide film formed by a CVD method, fixing intensity is improved.

Next, a mask made of resist is formed using a third photomask, and the first interlayer insulating film, the second interlayer insulating film 616, and the third interlayer insulating film 617 or the gate insulating film 613 are selectively etched to form a contact hole. Then, the mask made of resist is removed.

It is to be noted that the third interlayer insulating film 617 may be formed as needed. When the third interlayer insulating film 617 is not formed, after forming the second interlayer insulating film 616, the first interlayer insulating film, the second interlayer insulating film 616, and the gate insulating film 613 are selectively etched to form a contact hole.

Figure 20A:
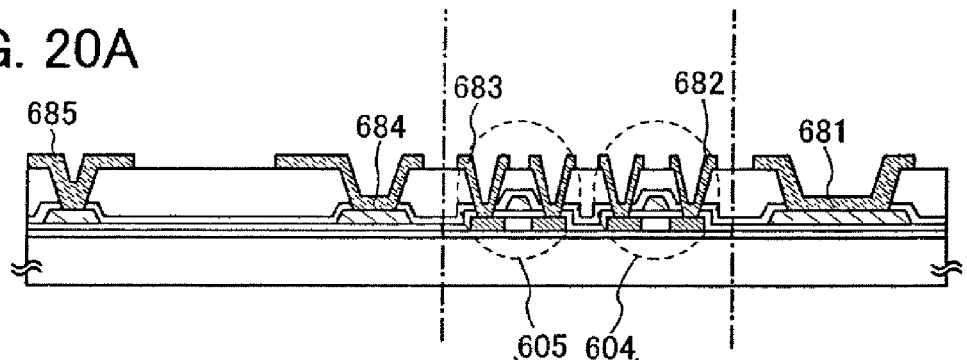
FIGS. 20A to 20D are views showing a process for manufacturing a photoelectric conversion device of the present invention.

Subsequently, after forming a metal stacked film by a sputtering method, a mask made of resist is formed using a fourth photomask, and then, the metal film is selectively etched to form a wiring 684, an electrode 685, an electrode 681, a source or drain electrode 682 of the 604, and a source or drain electrode 683 of the TFT 605 (refer to FIG. 20A). The wiring 684, the electrode 685, the electrode 681, the source or drain electrode 682, and the source or drain electrode 683 are formed of a single-layer conductive film. As such a conductive film, a titanium film (Ti film) is preferable. Instead of the titanium film, a single-layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the above element as its main component; or a single-layer film made of nitride thereof such as titanium nitride, tungsten nitride, tantalum nitride, or molybdenum nitride can be used.

Further, in a case where the wiring 684, the electrode 685, the electrode 681, the source or drain electrode 682, and the source or drain electrode 683 are formed to have a stacked structure of a refractory metal film and a low resistance metal film (such as an aluminum alloy or pure aluminum), the following is performed.

Figure 19D:
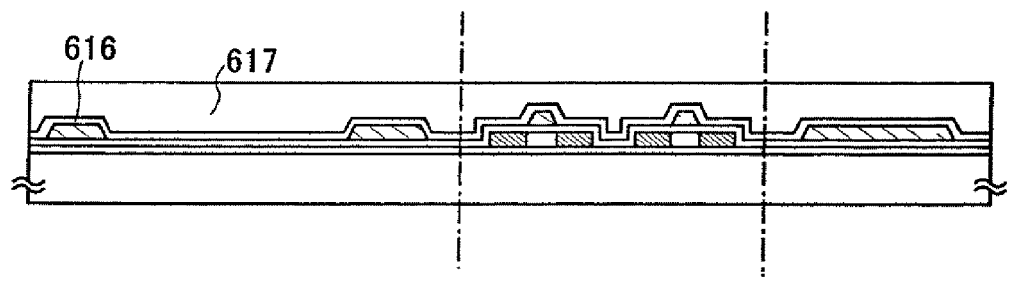
Figure 20B:
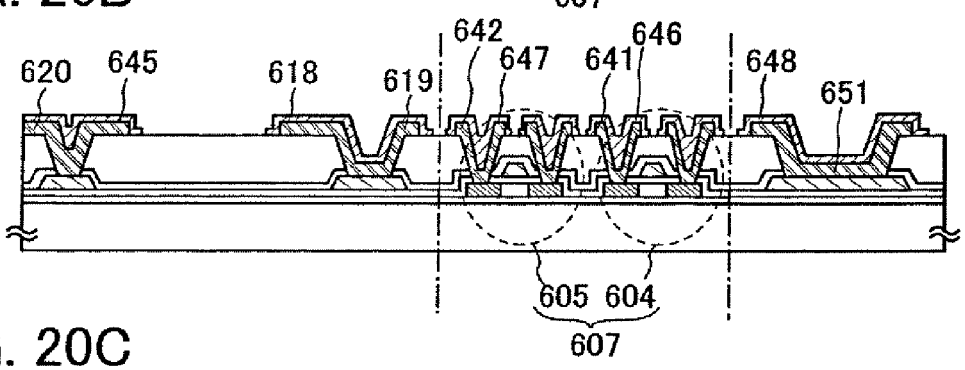

After formation of the state of FIG. 19D, a metal stacked film is formed by a sputtering method, and a mask made of resist is formed using a fourth photomask. Then, the first metal film is selectively etched to form a wiring 619, an electrode 620, an electrode 651, a source or drain electrode 641 of the TFT 604, and a source or drain electrode 642 of the TFT 605 (refer to FIG. 20B). Thereafter, the mask made of resist is removed. It is to be noted that the metal film in FIG. 20B is formed by stacking three layers of a Ti film with a film thickness of 100 nm, an Al film containing minute amounts of Si with a film thickness of 350 nm, and a Ti film with a film thickness of 100 nm.

Subsequently, a second metal film (such as titanium (Ti) or molybdenum (Mo)) is formed over the wiring 619, the electrode 620, the electrode 651, the source or drain electrode 641, and the source or drain electrode 642. Thereafter, a mask made of resist is formed using a fifth photomask, and the conductive metal film is selectively etched to form a protective electrode 618 covering the wiring 619 (refer to FIG. 20B). Here, a Ti film having a film thickness of 200 nm that is obtained by a sputtering method is used. Similarly to the wiring 619, each of the electrode 620, the electrode 651, the source or drain electrode 641 of the TFT 604, and the source or drain electrode 642 of the TFT 605 is covered with the conductive metal film to respectively form protective electrodes 645, 648, 646, and 647. Therefore, the conductive metal film covers each side surface where an Al film in a second layer of the electrode is exposed, and diffusion of an aluminum atom to the semiconductor film can be prevented.

Figure 20C:
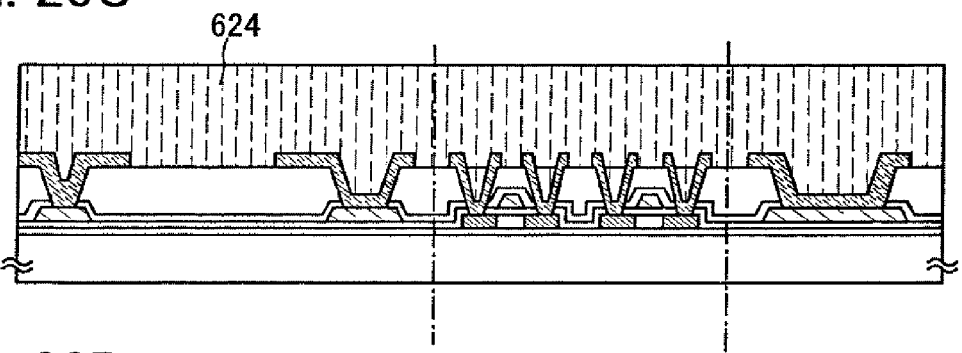
Figure 20D:
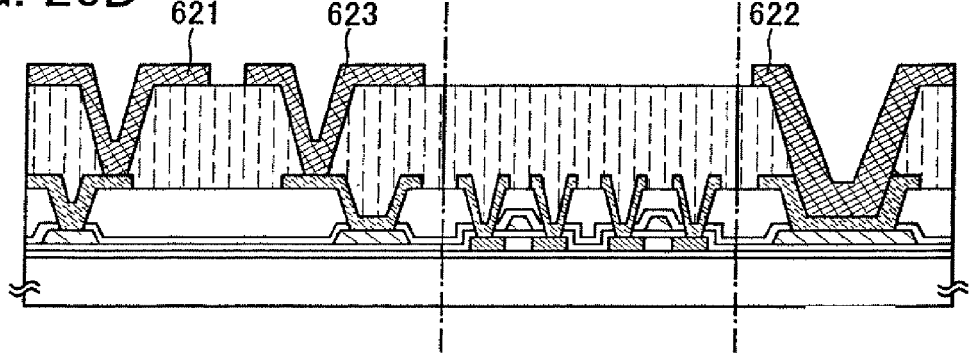

Next, a sealing layer 624 made of an insulating material (for example, an inorganic insulating film containing silicon) with a thickness of 1 to 30 μm is formed over an entire surface to obtain a state of FIG. 20C. Here, as an insulating material film, a silicon oxide film containing nitrogen with a film thickness of 1 μM is formed by a CVD method. By using an insulating film by a CVD method, improvement of adhesiveness is attempted.

Subsequently, the sealing layer 624 is etched to form an opening. Thereafter, electrodes 621, 622, and 623 are formed by a sputtering method (refer to FIG. 20D). Each of the electrodes 621 to 623 is a stacked-layer film of a titanium film (Ti film) (100 nm), a nickel film (Ni film) (300 nm), and a gold film (Au film) (50 nm). Fixing intensity of the electrodes 621 to 623 obtained as described above is more than 5N, which is sufficient fixing intensity for a terminal electrode.

As described above, a circuit board is manufactured. Then, a semiconductor device in which a unit cell $XU_i$ of a photosensor and a circuit board of this embodiment are incorporated will be explained with reference to FIG. 24, FIG. 25, and FIG. 26.

Figure 24:
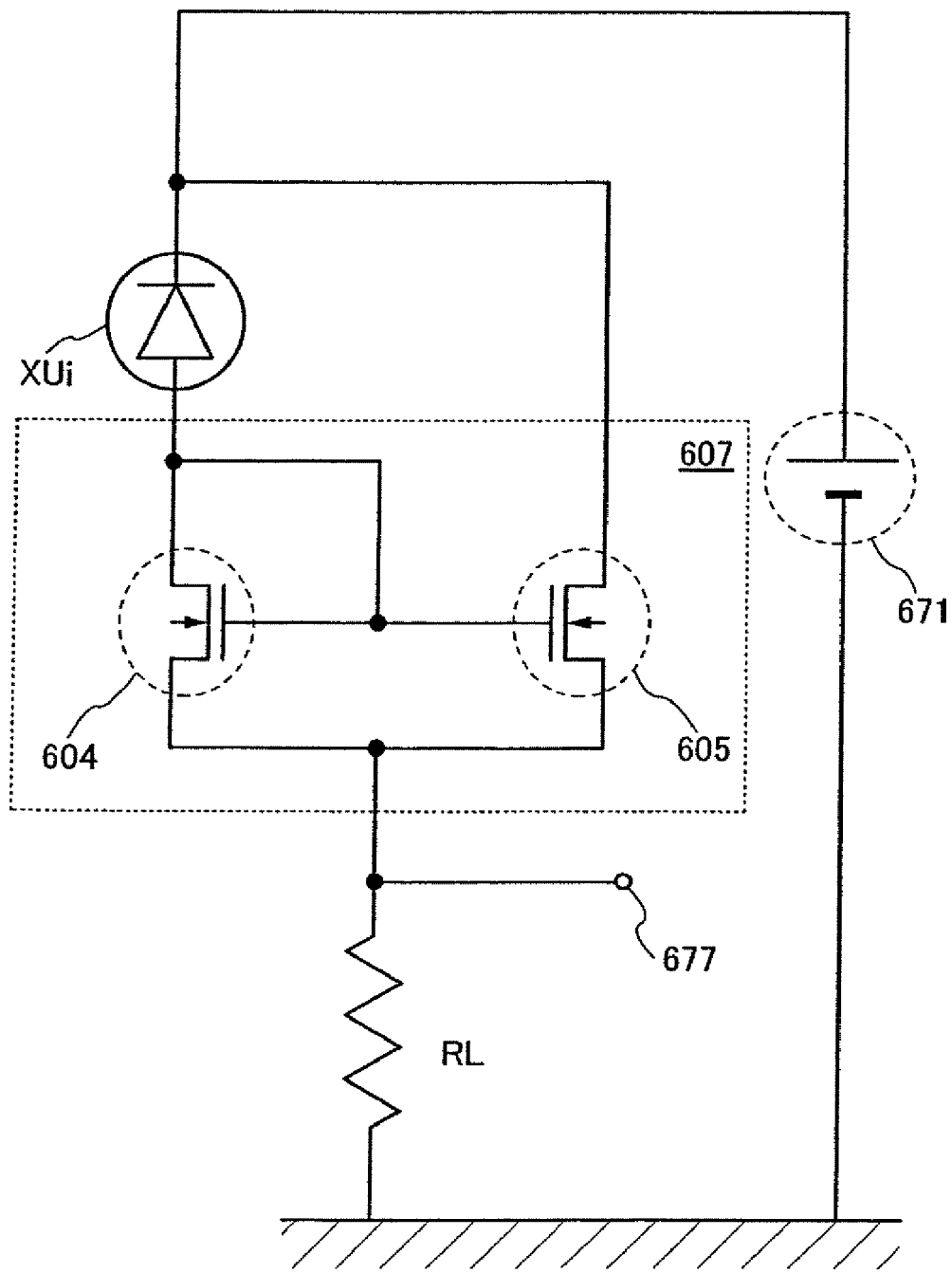
FIG. 24 is a circuit diagram of a photoelectric conversion device of the present invention.

As shown in FIG. 24, a semiconductor device of this embodiment includes a power supply (bias power supply) 671, a unit cell $XU_i$ of a photosensor, an amplifier circuit (for example, a current mirror circuit) 607 constituted by transistors 604 and 605, an output terminal 677, and a connection resistance $R_L$. In this embodiment, TFTs are used as the transistors 604 and 605, which are formed of n-channel TFTs. A light current is extracted outside by the output terminal 677.

In FIG. 24, a gate electrode of the TFT 604 constituting the current mirror circuit 607 is electrically connected to a gate electrode of the TFT 605 that also constitutes the current mirror circuit 607 and one of terminals of the unit cell $XU_i$ of a photosensor. One of a source region and a drain region of the TFT 604 is electrically connected to the other terminal of the unit cell $XU_i$ of a photosensor and the gate electrode of the TFT 605. Further, the other of the source region and the drain region of the TFT 604 is electrically connected to one of a source region and a drain region of the TRFT 605, the output terminal 677, and the connection resistance $R_L$.

The gate electrode of the TFT 605 is electrically connected to the gate electrode of the TFT 604, and one of the source region or the drain region of the TFT 604. One of the source region and the drain region of the TFT 605 is electrically connected to the other of the source region and the drain region of the TFT 604, the output terminal 677, and the connection resistance $R_L$. Further, the other of the source region and the drain region of the TFT 605 is electrically connected to one of terminals of the unit cell $XU_i$ of a photosensor. The gate electrodes of the TFTs 604 and 605 are connected to each other; therefore, common potential is applied.

One of terminals of the unit cell $XU_i$ of a photosensor is electrically connected to one of the source region and the drain region of the TFT 604, the gate electrode of the TFT 604, and the gate electrode of the TFT 605. The other terminal of the unit cell $XU_i$ of a photosensor is connected to the power supply 671.

Further, one of terminals of the connection resistance $R_L$ and the power supply 671 is each connected to ground.

Figure 25:
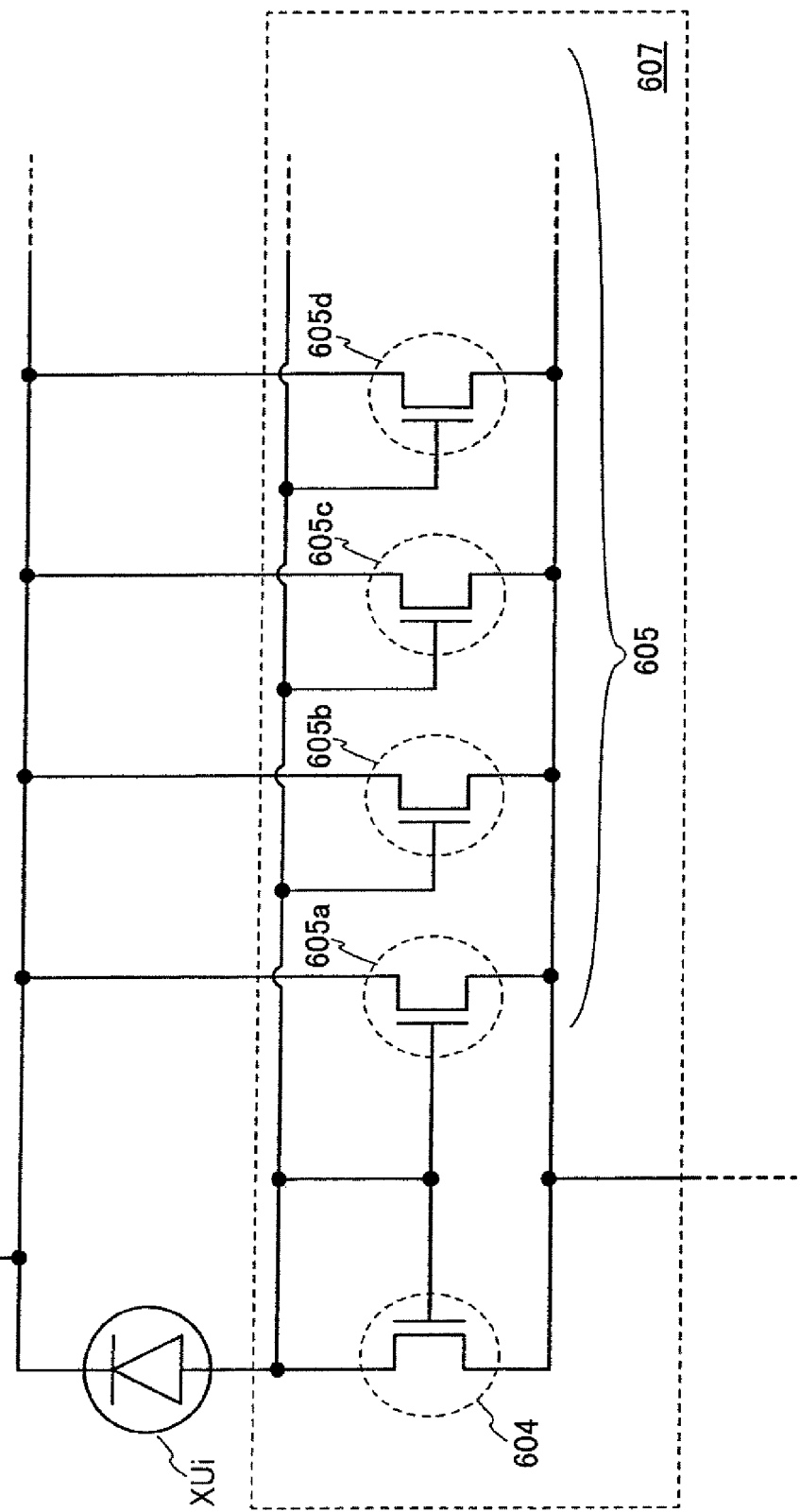
FIG. 25 is a circuit diagram of a photoelectric conversion device of the present invention.

Although two TFTs are shown in FIG. 24, in order to obtain an output value to be increased by m times, one piece of n-channel TFT 604 and in pieces of n-channel TFTs 605 may be arranged (refer to FIG. 25). For example, if an output value is desired to be increased by 100 times, one piece of n-channel TFT 604 and 100 pieces of n-channel TFTs 605 may be arranged. It is to be noted that, in FIG. 25, the same portions as FIG. 24 are denoted by the same reference numeral. In FIG. 24, the n-channel TFT 605 is constituted by m pieces of n-channel TFTs 605 that is, n-channel TFTs 605a, 605b, 605c, 605d, . . . , and 605m. Thus, a light current generated in the unit cell $XU_i$ of a photosensor is amplified to be m times, and be outputted.

Further, although FIG. 24 shows an equivalent circuit diagram in which the current mirror circuit 607 is used in an n-channel TFT, only a p-channel may be used instead of the n-channel TFT.

Figure 26:
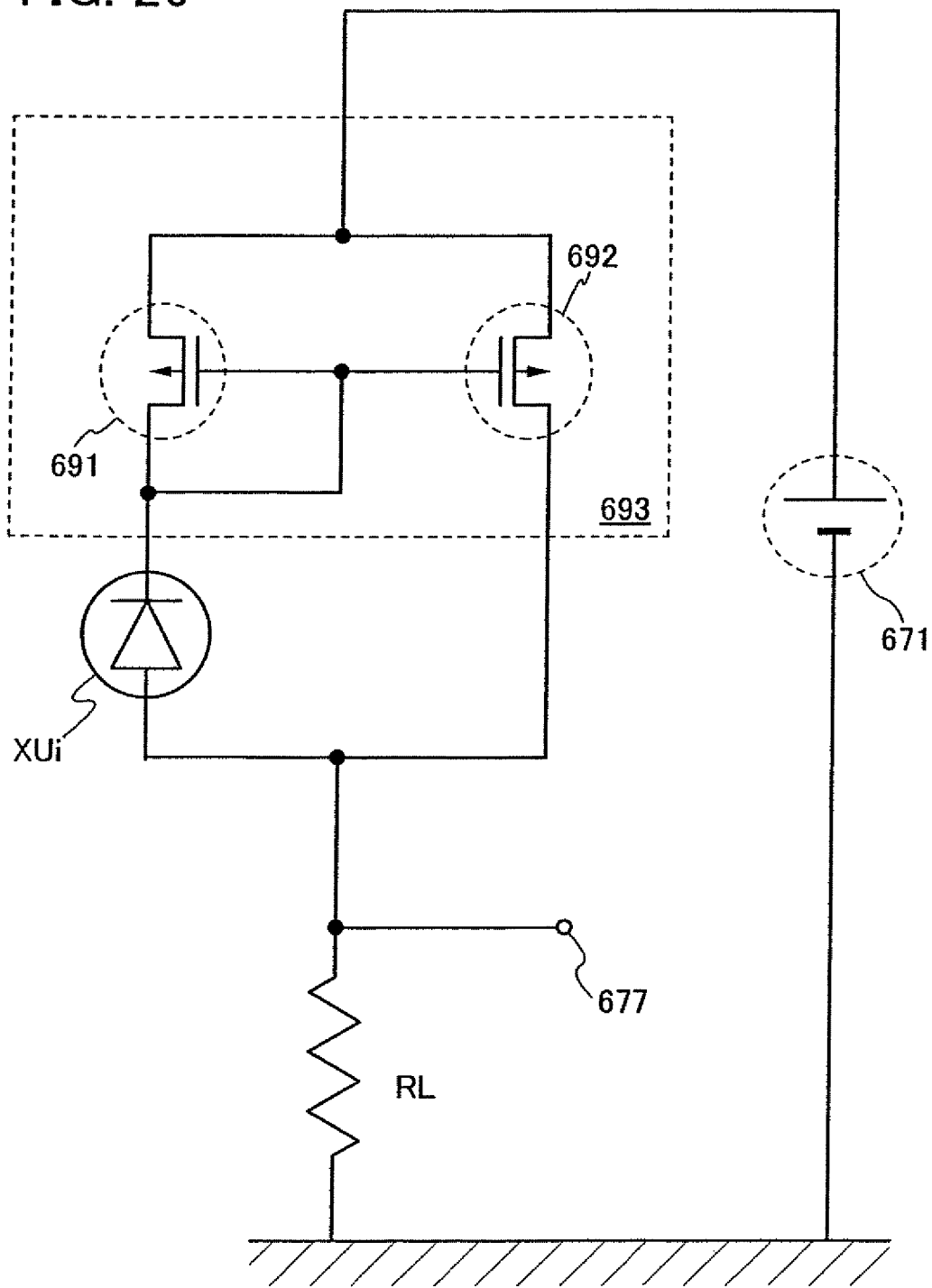
FIG. 26 is a circuit diagram of a photoelectric conversion device of the present invention.

In a case where an amplifier circuit is formed by a p-channel TFT, an equivalent circuit as shown in FIG. 26 is formed. In FIG. 26, the same portions as FIG. 24 and FIG. 25 are denoted by the same reference numerals. A unit cell $XU_i$ of a photosensor is preferably connected to a current mirror circuit 693 constituted by p-channel TFTs 691 and 692 as shown in FIG. 26.

In FIG. 18, FIGS. 19A to 19D, FIGS. 20A to 20D, FIG. 24, FIG. 25, and FIG. 26, each of the n-channel TFTs 604 and 605 and the p-channel TFTs 691 and 692 shows an example of a top gate TFT that has a structure including one channel formation region (referred to as a "single gate structure" in the present specification). However, each TFT may have a structure that has a plurality of channel formation regions so as to reduce variation of an on-current value. In addition, in order to reduce an off-current value, each of the n-channel TFTs 604 and 605 and the p-channel TFTs 691 and 692 may be provided with a lightly doped drain (LDD) region. The LDD region is a region where an impurity element is added at a low concentration between a channel formation region and a source region or a drain region which is formed by adding an impurity element at a high concentration. When the LDD region is provided, there is an effect that an electric field in the vicinity of the drain region is reduced and deterioration due to hot carrier injection is prevented. Further, in order to prevent deterioration of an on-current value due to hot carriers, each of the n-channel TFTs 604 and 605 and the p-channel TFTs 691 and 692 may have a structure in which the LDD region is overlapped with the gate electrode through the gate insulating film (referred to as a "GOLD (Gate-drain Overlapped LDD) structure" in the present specification). Alternatively, either of the n-channel TFT or the p-channel TFT may be provided with the LDD region.

In a case where the GOLD structure is employed, there is an effect that an electric field in the vicinity of the drain region is further relieved and deterioration due to hot carrier injection is further prevented as compared to a case where the LDD region is not overlapped with the gate electrode. By employing such a GOLD structure, electric field intensity in the vicinity of the drain region is reduced to prevent the hot carrier injection, which is effective for prevention of a deterioration phenomenon.

Further, each of the TFTs 604 and 604 constituting the current mirror circuit 607 and the TFTs 691 and 692 constituting the current mirror circuit 693 may be a bottom gate TFT, for example, a reverse stagger TFT instead of the top gate TFT. In this case, the gate electrode preferably has a light transmitting property so as not to block light to be received.

Embodiment 3

In this embodiment, a unit cell of a photosensor having a different structure from that of Embodiment 2, and a method for manufacturing the unit cell will be explained with reference to FIGS. 21A to 21C, FIGS. 22A to 22C, and FIG. 23. It is to be noted that, in this embodiment, the same portions as Embodiment 1 and Embodiment 2 are denoted by the same reference numerals, and in a case where materials, processes, and the like are not particularly described, those of Embodiment 1 and Embodiment 2 are adopted.

First, processes to forming the photoelectric conversion layer 405 shown in FIG. 813 are performed, which is based on Embodiment 1. Then, an insulating layer 701 is formed over the photoelectric conversion layer 405 (refer to FIG. 21A). The insulating layer 701 may be formed by the same process, material, and the like as the sealing resin layer 406 in Embodiment 1.

Figure 21A:
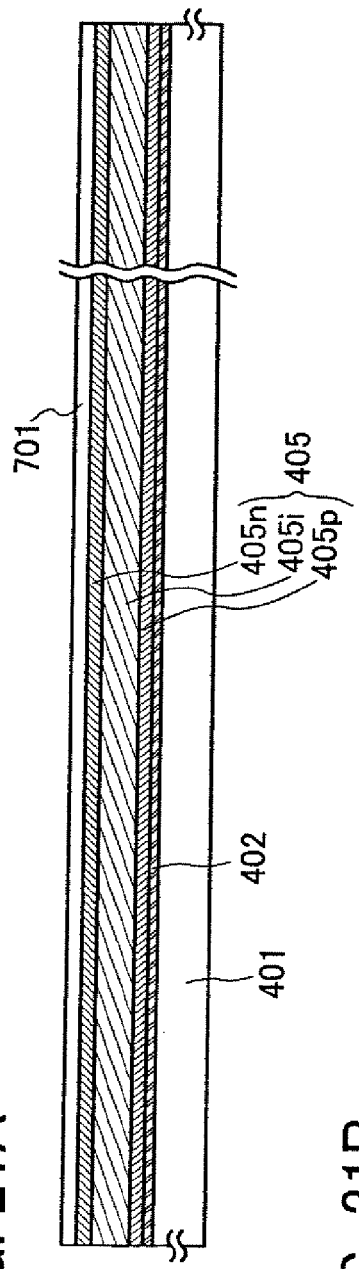
FIGS. 21A to 21C are views showing a process for manufacturing a photoelectric conversion device of the present invention.
Figure 21B:
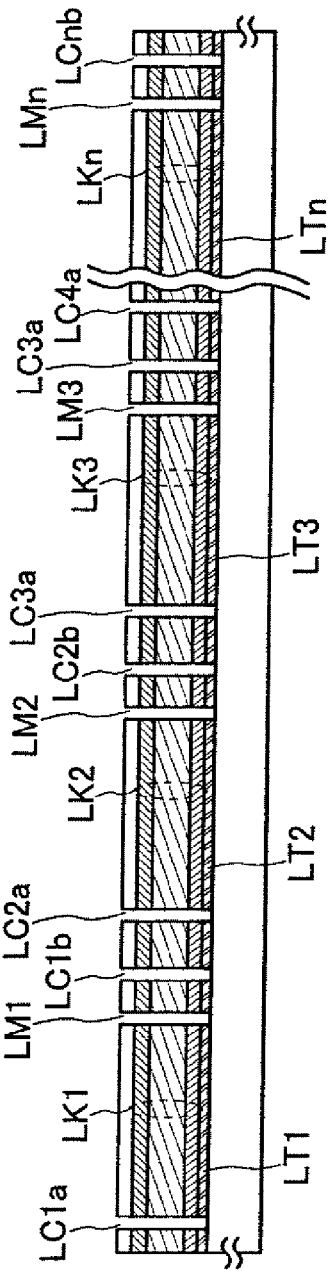

Subsequently, openings $LM_1$ to $LM_n$, $LC_{1a}$ to $LC_{na}$, and $LC_{1b}$ to $LC_{nb}$ are formed by a laser processing method (laser scribe) from an insulating layer 701 side (refer to FIG. 21B). Although the openings $LM_1$ to $LM_n$, $LC_{1a}$ to $LC_{na}$, and $LC_{1b}$ to $LC_{nb}$ reach the substrate 401 in FIG. 21B, the openings $LM_1$ to $LM_n$ may be formed so that transparent electrode layers $LT_1$ to $LT_n$ and connection electrode layers $LE_{1b}$ to $LE_{nb}$ are electrically connected to each other in the subsequent process. In other words, the openings $LM_1$ to $LM_n$ may reach the substrate 401 or reach the transparent electrode layer 402. Further, the openings $LC_{1a}$ to $LC_{na}$ and $LC_{1b}$ to $LC_{nb}$ may be formed so as to electrically isolate an element in the subsequent process.

The openings $LC_{1a}$ to $LC_{na}$ and $LC_{1b}$ to $LC_{nb}$ are openings for electrically isolation and provided to form unit cells $LU_1$ to $LU_n$. The unit cells $LU_i$ (i=1, 2, ..., n) has the openings $LC_{ia}$ and $LC_{ib}$. Further, the openings $LM_1$ to $LM_n$ are openings for forming connection of a transparent electrode layer and an electrode layer to each other.

By forming the openings $LM_1$ to $LM_n$, $LC_{1a}$ to $LC_{na}$, and $LC_{1b}$ to $LC_{nb}$, the transparent electrode layer 402 is divided into $LT_1$ to $LT_n$, and the photoelectric conversion layer 405 is divided into $LK_1$ to $LK_n$.

Figure 21C:
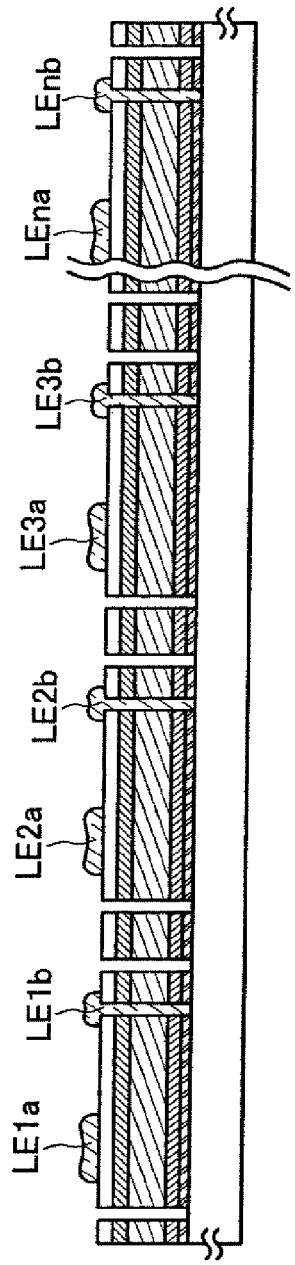

Then, the openings $LM_1$ to $LM_n$ are filled with a conductive paste by an ink jet method, a screen printing method, or the like as shown in FIG. 21C to form electrode layers $LE_{1b}$, to $LE_{nb}$. In addition, electrode layers $LE_{1a}$ to $LE_{na}$ are formed over a top layer of the photoelectric conversion layer 405, which is the n-type semiconductor layer 405n in this embodiment. As a material of the electrode layers $LE_{1a}$ to $LE_{na}$ and $LE_{1b}$ to $LE_{nb}$, the same material as the connection electrode layers $E_1$ to $E_n$ described in Embodiment 1 may be used.

Figure 22A:
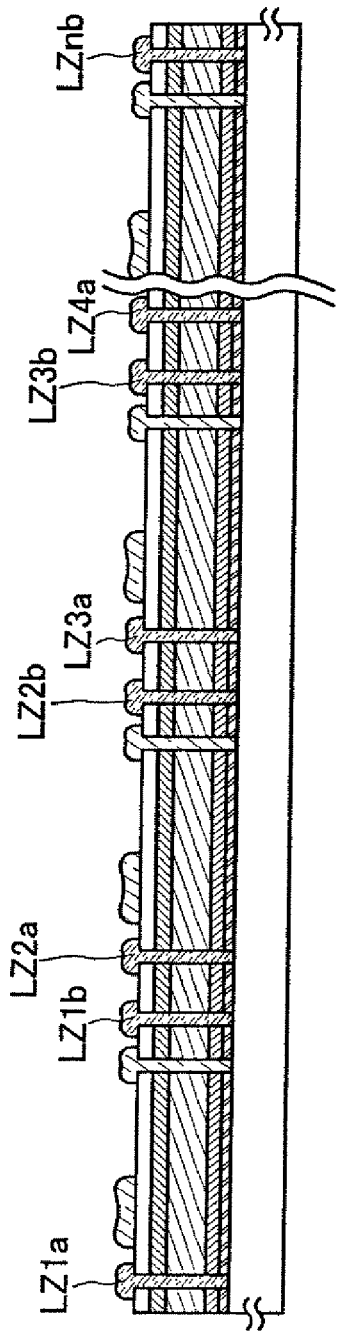
FIGS. 22A to 22C are views showing a process for manufacturing a photoelectric conversion device of the present invention.
Figure 22B:
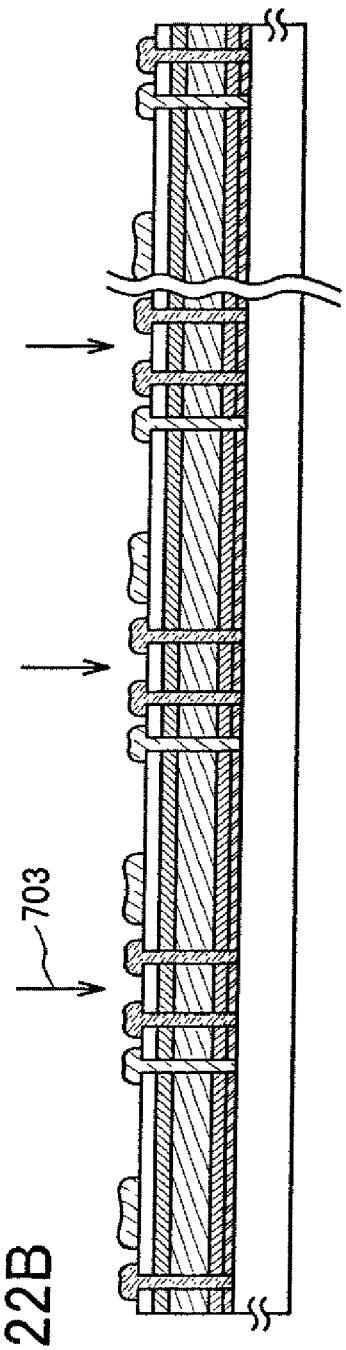
Figure 22C:
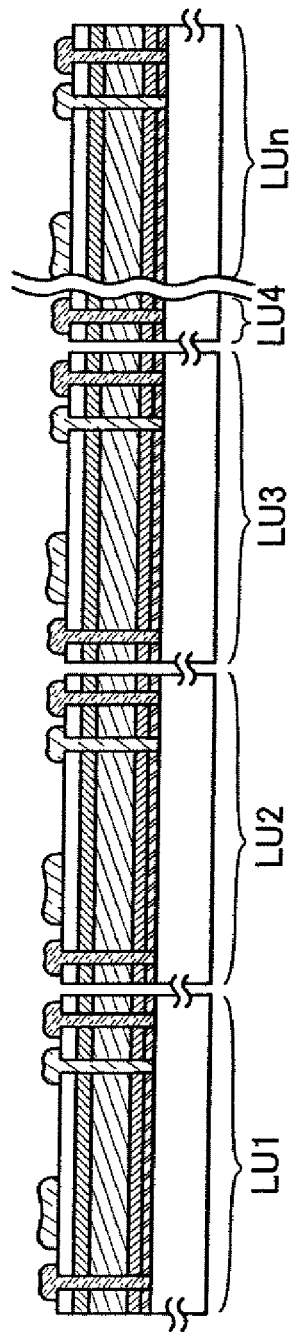

Next, the openings $LC_{1a}$ to $LC_{na}$ and $LC_{1b}$ to $LC_{nb}$ are filled with insulating resin layers $LZ_{1a}$ to $LZ_{na}$ and $LZ_{1b}$ to $LZ_{nb}$ to electrically isolate an element (refer to FIG. 22A). The insulating resin layers $LZ_{1a}$ to $LZ_{na}$ and $LZ_{1b}$ to $LZ_{nb}$ may be formed by the same process as that of the insulating resin layers $Z_1$ to $Z_n$ described in Embodiment 1.

In this embodiment, the electrode layers $LE_{1a}$ to $LE_{na}$ and $LE_{1b}$ to $LE_{nb}$ are formed first. However, either the electrode layers $LE_{1a}$ to $LE_{na}$ and $LZ_{1b}$ to $L_{nb}$ or the insulating resin layers $LZ_{1a}$ to $LZ_{na}$ and $LZ_{1b}$ to $LZ_{nb}$ may be formed first.

Subsequently, the substrate 401, the transparent electrode layers $LT_1$ to $LT_n$, the photoelectric conversion layers $LK_1$ to $LK_n$, the electrode layers $LE_{1a}$ to $LE_{na}$ and $LE_{1b}$ to $LE_{nb}$, the insulating resin layers $LZ_{1a}$ to $LZ_{na}$ and $LZ_{1b}$ to $LZ_{nb}$, and the insulating layer 701 are each divided into unit cells $LU_1$ to $LU_n$ by laser describe. For division into the unit cells $LU_1$ to $LU_n$, regions between the insulating layers $LZ_{1b}$ and $LZ_{2a}$ to between the insulating resin layers $LZ_{(-1)b}$ and $LZ_{na}$ may be irradiated with a laser beam 703 (refer to FIGS. 22B and 22C).

Figure 23:
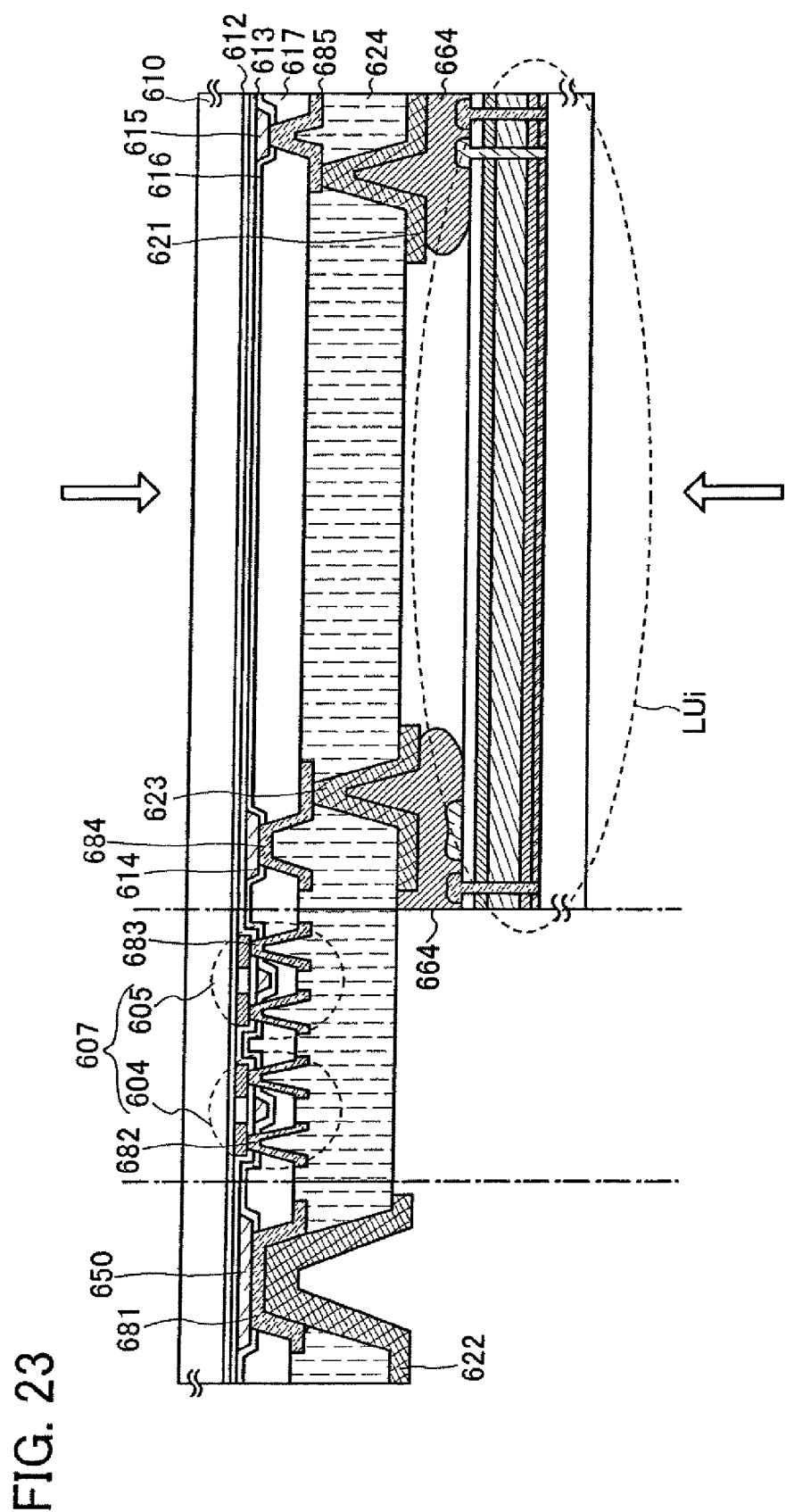
FIG. 23 is a view showing a process for manufacturing a photoelectric conversion device of the present invention.

FIG. 23 shows a mode in which the unit cell $LU_i$ (i=1, 2, ..., n) of a photosensor manufactured as described above is connected to a circuit board provided with an amplifier circuit, which is based on Embodiment 2. In FIG. 23, the same portions as FIG. 18 are denoted by the same reference numerals. Further, the circuit board may be manufactured similarly to Embodiment 2.

It is to be noted that this embodiment can be combined with any description of Embodiment Modes 1 and 2 and Embodiments 1 and 2.

Embodiment 4

In this embodiment, an example in which a photosensor that is obtained by Embodiments 2 and 3 is incorporated into various electronic appliances will be explained. As electronic appliances to which the present invention is applied, a computer, a display, a cellular phone, a television, and the like can be given. Specific examples of those electronic appliances are shown in FIG. 27, FIGS. 28A and 28B, FIGS. 29A and 29B, FIG. 30, and FIGS. 31A and 31B.

Figure 27:
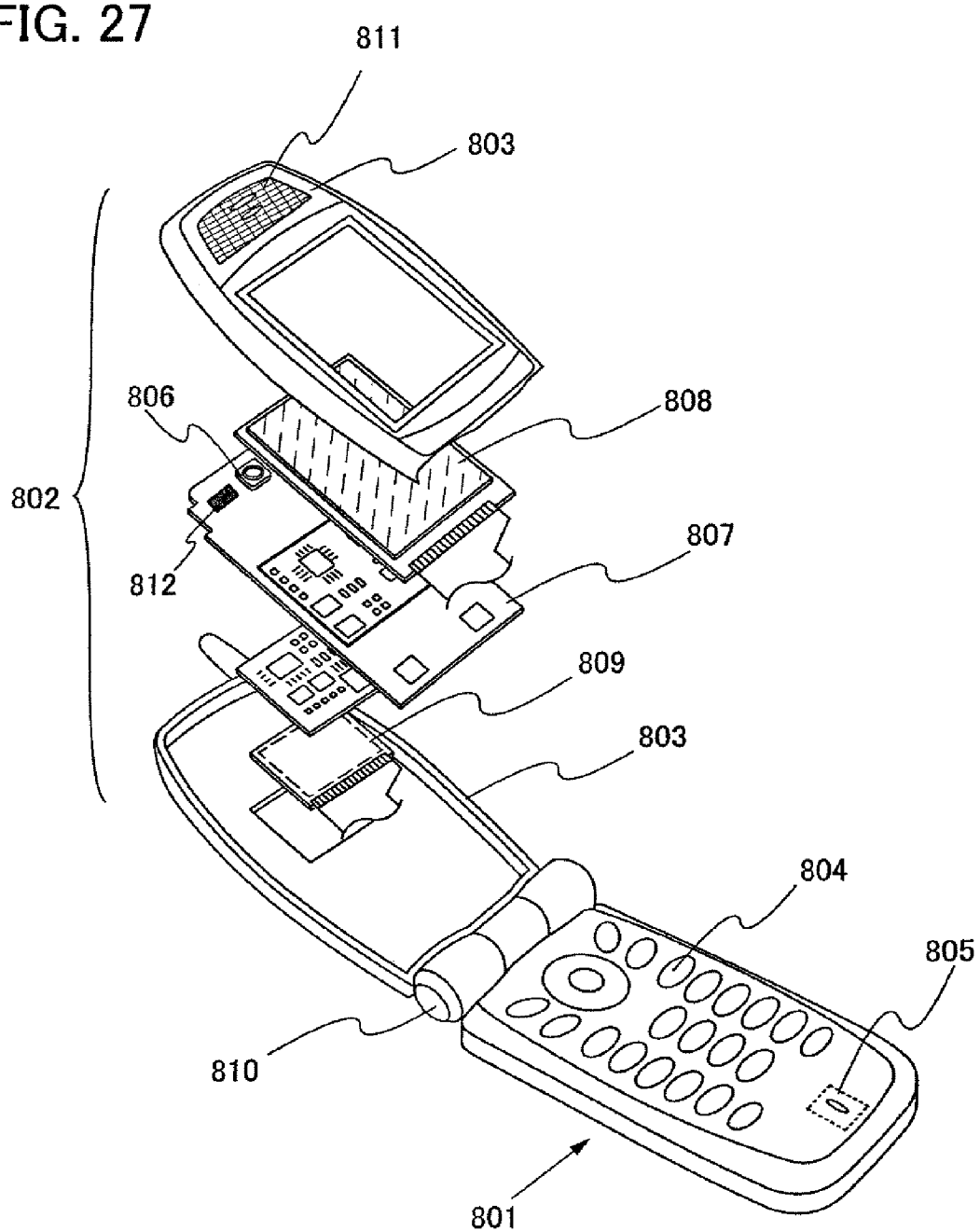
FIG. 27 is a view showing a device on which a photoelectric conversion device of the present invention is mounted.

FIG. 27 shows a cellular phone, which includes a main body (A) 801, a main body (B) 802, a chassis 803, operation keys 804, an audio input portion 805, an audio output portion 806, a circuit board 807, a display panel (A) 808, a display panel (B) 809, a hinge 810, a light-transmitting material portion 811, and a photosensor 812. The photosensor 812 may be manufactured based on Embodiments 2 and 3.

The photosensor 812 detects light that passes through the light-transmitting material portion 811 and controls a luminance of the display panel (A) 808 and the display panel (B) 809 based on illuminance of the detected external light, or controls illumination of the operation keys 804 based on the illuminance obtained by the photosensor 812. In this manner, a consumption current of the cellular phone can be suppressed.

Figure 28A:
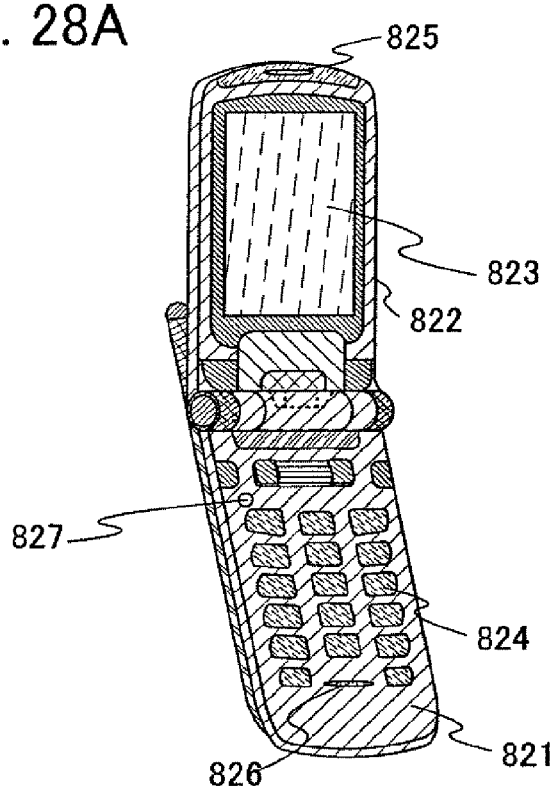
FIGS. 28A and 28B are views showing a device on which a photoelectric conversion device of the present invention is mounted.
Figure 28B:
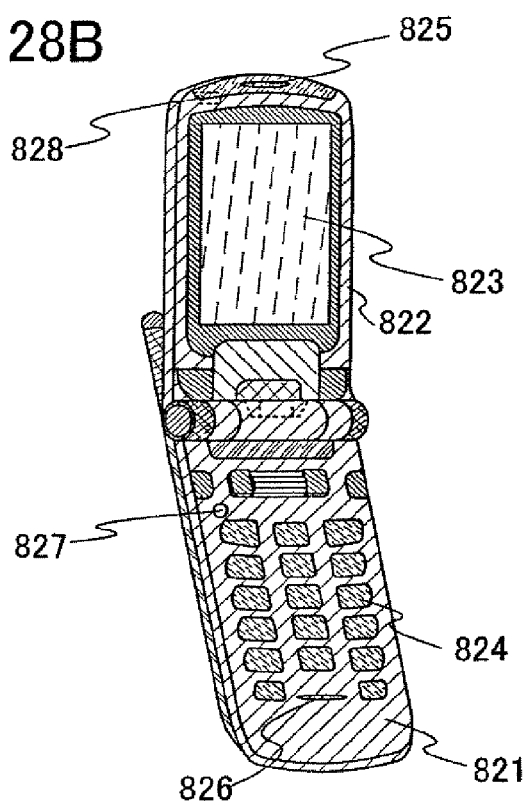

FIGS. 28A and 28B show other examples of a cellular phone. In FIGS. 28A and 28B, reference numeral 821 denotes a main body; 822, a chassis; 823, a display panel; 824, operation keys; 825, an audio output portion; 826, an audio input portion; and 827, a photosensor.

In the cellular phone shown in FIG. 28A, a luminance of the display panel 823 and the operation keys 824 can be controlled by detecting external light by the photosensor 827 provided in the main body 821.

Further, in the cellular phone shown in FIG. 28B, a photosensor 828 is provided in the main body 821 in addition to the structure of FIG. 28A. By the photosensor 828, a luminance of a backlight provided in a display panel 823 can be detected.

Figure 29A:
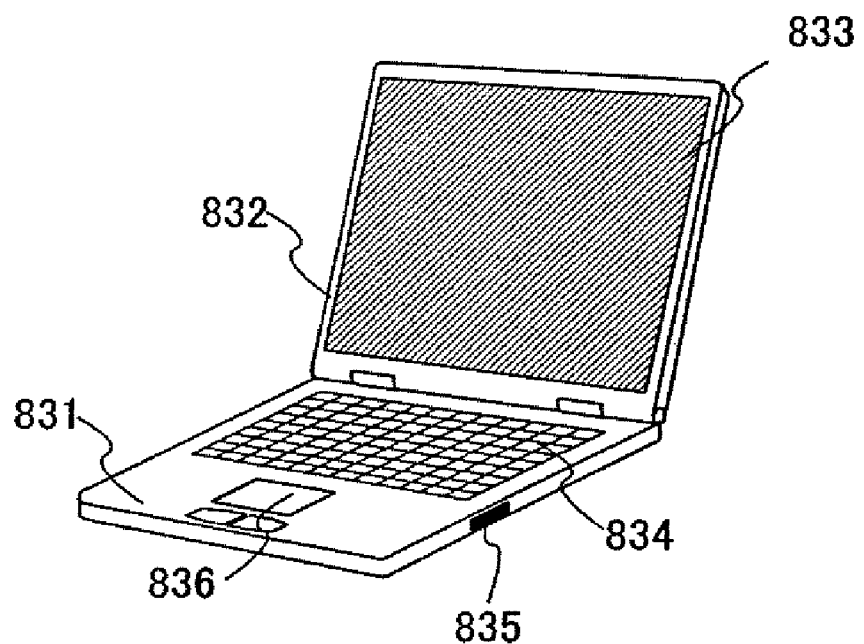
FIGS. 29A and 29B are views showing a device on which a photoelectric conversion device of the present invention is mounted.

FIG. 29A shows a computer, which includes a main body 831, a chassis 832, a display portion 833, a key board 834, an external connecting port 835, a pointing mouse 836, and the like.

Figure 29B:
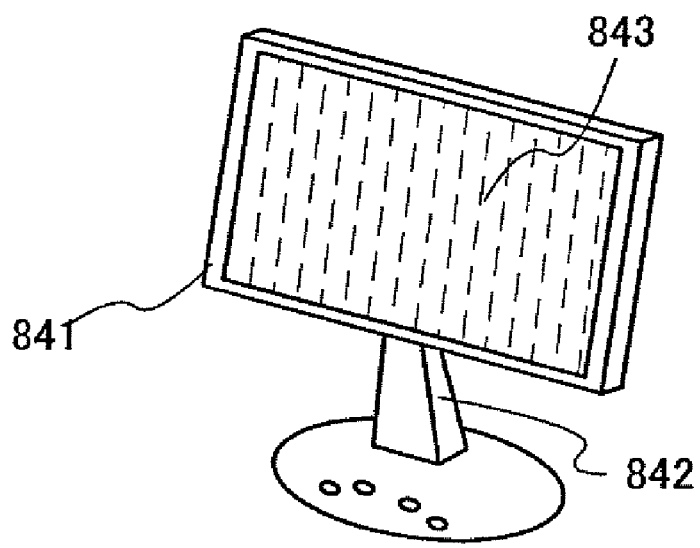

FIG. 29B shows a display device such as a television receiver. This display device includes a chassis 841, a supporting body 842, a display portion 843, and the like.

Figure 30:
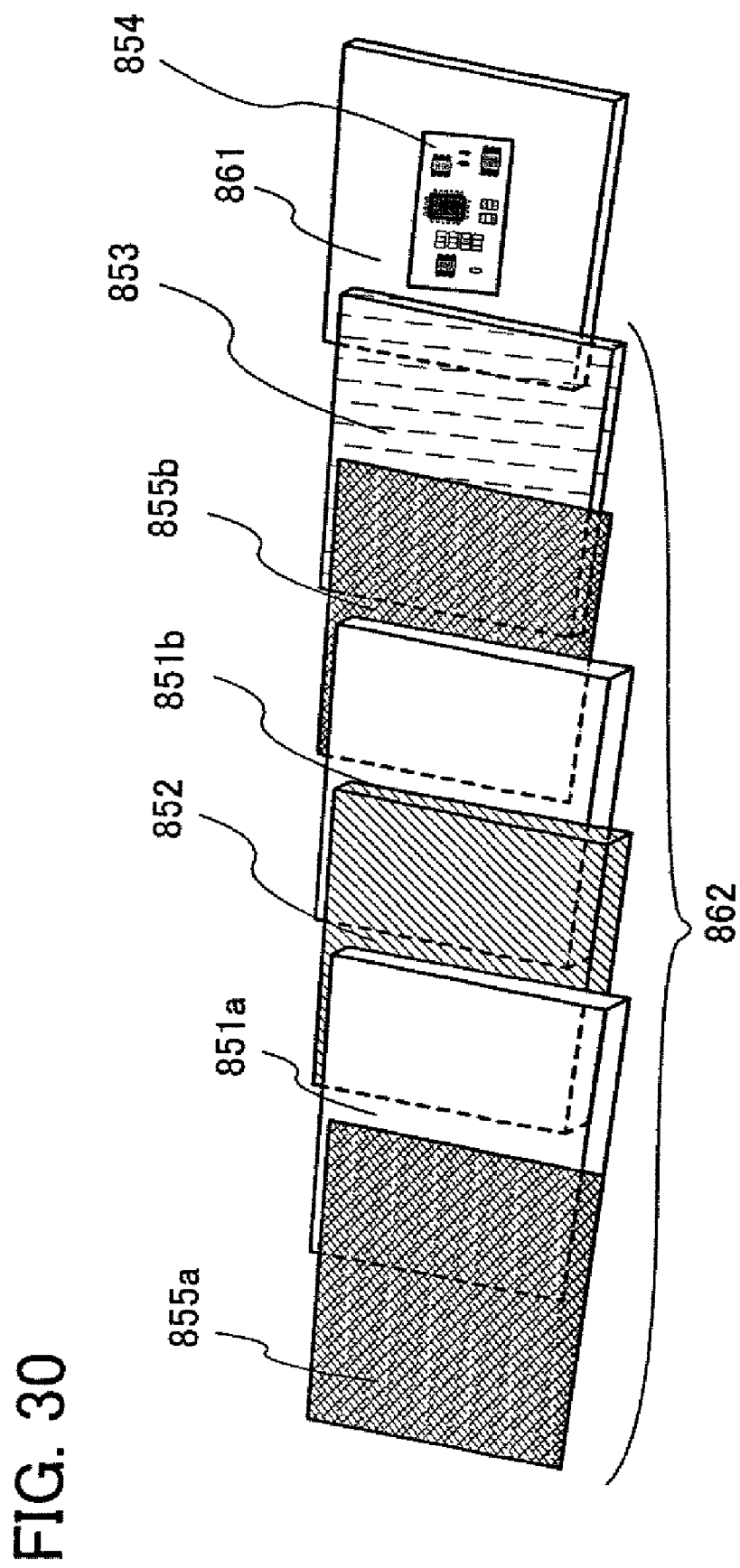
FIG. 30 is a view showing a device on which a photoelectric conversion device of the present invention is mounted.

FIG. 30 shows a detailed structure of a case where a liquid crystal panel is used for the display portion 833 of the computer shown in FIG. 29A and the display portion 843 of the display device shown in FIG. 29B.

A liquid crystal panel 862 shown in FIG. 30 is incorporated in a chassis 861, which includes substrates 851a and 851b, a liquid crystal layer 852 interposed between the substrates 851a and 851b, polarizing filters 855a and 855b, a backlight 853, and the like. In the chassis 861, a photoelectric conversion element formation region 854 having a photosensor is formed.

The photoelectric conversion element formation region 854 manufactured by using the present invention detects amount of light from the backlight 853, and information thereof is fed back to adjust a luminance of the liquid crystal panel 862.

Figure 31A:
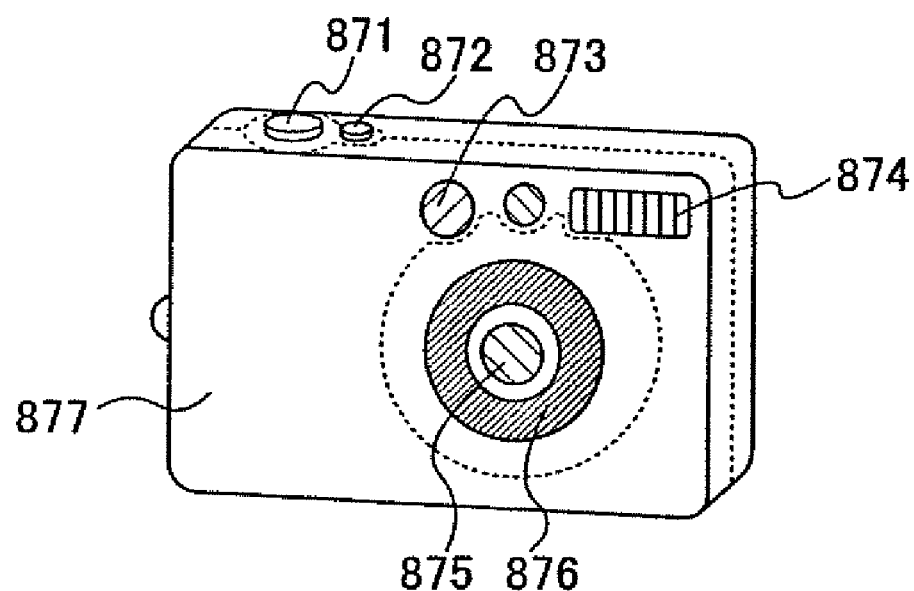
FIGS. 31A and 31B are views showing a device on which a photoelectric conversion device of the present invention is mounted.
Figure 31B:
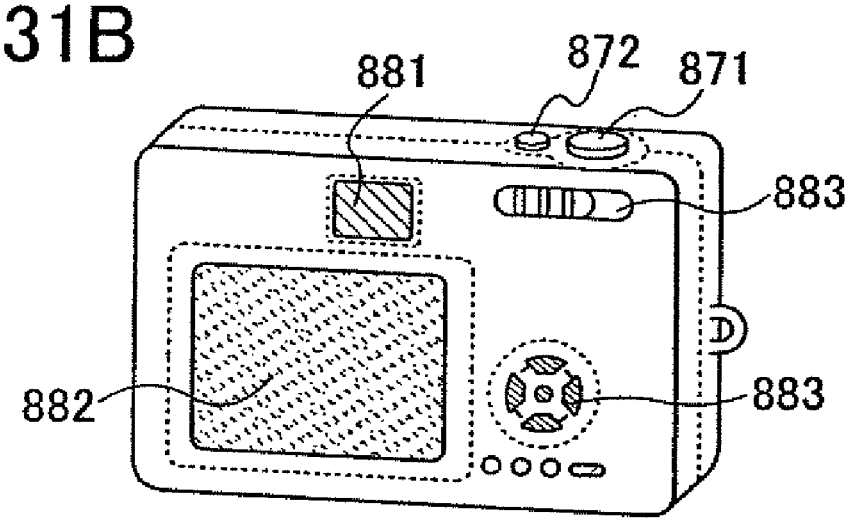

FIGS. 31A and 31B show an example in which a photosensor of the present invention is incorporated in a camera, for example, a digital camera. FIG. 31A is a perspective view seen from a front side of the digital camera. FIG. 31B is a perspective view seen from a back side of the digital camera. In FIG. 30A, the digital camera is provided with a release button 871, a main switch 872, a viewfinder 873, a flash portion 874, a lens 875, a barrel 876, and a chassis 877.

In FIG. 31B, an eyepiece finder 881, a monitor 882, and operation buttons 883 are provided.

When the release button 871 is pushed down to the half point, a focus adjustment mechanism and an exposure adjustment mechanism are operated, and when the release button is pushed down to the lowest point, a shutter is opened.

By pushing down or rotating the main switch 872, a power supply of the digital camera is switched on or off.

The viewfinder 873 is arranged above the lens 875, which is on the front side of the digital camera, for checking a shooting range and the focus point from the eyepiece finder 881 shown in FIG. 31B.

The flash portion 874 is arranged in the upper position on the front side of the digital camera. When the subject brightness is not enough, auxiliary light is emitted from the flash portion 874, at the same time as the release button 871 is pushed down and a shutter is opened.

The lens 875 is arranged at the front side of the digital camera and made of a focusing lens, a zoom lens, and the like. The lens forms a photographic optical system with a shutter and a diaphragm, which are not shown. In addition, behind the lens, an imaging device such as a CCD (Charge Coupled Device) is provided.

The barrel 876 moves a lens position to adjust the focus of the focusing lens, the zoom lens, and the like. In shooting, the barrel is slid out to move the lens 875 forward. Further, when carrying the digital camera, the lens 875 is moved backward to be compact. It is to be noted that a structure is employed in this embodiment, in which the subject can be photographed by zoom by sliding out the barrel; however, the present invention is not limited to this structure, and a structure may also be employed for the digital camera, in which shooting can be performed by zoom without sliding out the barrel with the use of a structure of a photographic optical system inside the chassis 877.

The eyepiece finder 881 is arranged in the upper position on the back side of the digital camera for looking therethrough in checking a shooting range and the focus point.

The operation buttons 883 are each a button for various functions provided on the back side of the digital camera, which includes a set up button, a menu button, a display button, a functional button, a selecting button, and the like.

When a photosensor of the present invention is incorporated into the camera shown in FIGS. 31A and 31B, the photosensor can detect whether light exists or not, and light intensity. Thus, exposure adjustment or the like of a camera can be performed.

A photosensor of the present invention can be applied to other electronic appliances, for example, a projection TV, a navigation system, and the like. In other words, the photosensor can be used for any electronic appliance as long as it needs to detect light.

It is to be noted that this embodiment can be combined with any description in Embodiment Modes 1 and 2 and Embodiments 1 to 3.

In accordance with the present invention, a film formation apparatus can be achieved, in which damage to a light receiving region and curling of a substrate in film formation can be suppressed. Further, by forming a film by using a film formation apparatus of the present invention, damage to a light receiving region and curling of a substrate can be suppressed. Therefore, a highly reliable photoelectric conversion device can be obtained.

A film formation apparatus according to the present invention can be applied to a use of forming a thin film over a lengthy film substrate in addition to a photoelectric conversion device disclosed in the present specification. For example, when a diamond like carbon (DLC) film is formed over a flexible substrate, the present invention can be applied. In addition, a structure of a film formation chamber is made to be suitable for forming a thin film by sputtering, whereby the present invention can be applied in forming a transparent conductive film over a flexible substrate.

This application is based on Japanese Patent Application serial no. 2005-279117 filed in Japan Patent Office on Sep. 27, 2005, the entire contents of which are hereby incorporated by reference.

What is claimed is:

1. A method for manufacturing a photoelectric conversion device, comprising:
    sending a substrate from a roller for sending a substrate, which is provided in a first transfer chamber;
    forming a first semiconductor film over the substrate by making the substrate pass through a first discharging electrode provided in a first film formation chamber;
    transferring the substrate on which the first semiconductor film is formed through a first slit provided in a first buffer chamber;
    forming a second semiconductor film over the first semiconductor film by making the substrate pass through a second discharging electrode provided in a second film formation chamber;
    transferring the substrate on which the second semiconductor film is formed through a second slit provided in a second buffer chamber;
    forming a third semiconductor film having opposite conductivity to the first semiconductor film over the second semiconductor film by making the substrate pass through a third discharging electrode provided in a third film formation chamber; and
    rewinding the substrate over which the first to third semiconductor films are formed by a roller for rewinding a substrate, which is provided in a second transfer chamber,
    wherein each of the first slit and the second slit is provided with at least one touch roller, and the touch roller is in contact with a surface of the substrate on which the semiconductor film is formed.

2. A method for manufacturing a photoelectric conversion device according to claim 1, wherein the second transfer chamber is provided with a roller for sending a protective sheet, and the protective sheet is sent to be in contact with a surface on which the third semiconductor film is formed and rewound together with the substrate by the roller for rewinding a substrate.

3. A method for manufacturing a photoelectric conversion device according to claim 2, wherein the protective sheet is paper, metal foil, or an organic film.

4. A method for manufacturing a photoelectric conversion device according to claim 1, wherein the second discharging electrode has an upper electrode and a lower electrode, the upper electrode is divided into a plurality, and an insulator is formed between each upper electrode divided into a plurality.

5. A method for manufacturing a photoelectric conversion device according to claim 1, wherein the substrate is any one of a polyethylene naphthalate (PEN) film, a polyethylene terephthalate (PET) film, and a polybutylene naphthalate (PBN) film.

6. A method for manufacturing a photoelectric conversion device according to claim 1, wherein each of the first to third semiconductor films is any one of a silicon film, a germanium film, and a silicon film containing germanium.

7. A method for manufacturing a photoelectric conversion device according to claim 1, wherein the photoelectric conversion device is a solar battery.

8. A method for manufacturing a photoelectric conversion device according to claim 1, wherein the photoelectric conversion device is a photosensor.

* * * * *

UNITED STATES PATENT AND TRADEMARK OFFICE
CERTIFICATE OF CORRECTION

PATENT NO. : 7,985,664 B2  
APPLICATION NO. : 12/627473  
DATED : July 26, 2011  
INVENTOR(S) : Hiura et al.

Page 1 of 1

Figure 5A:
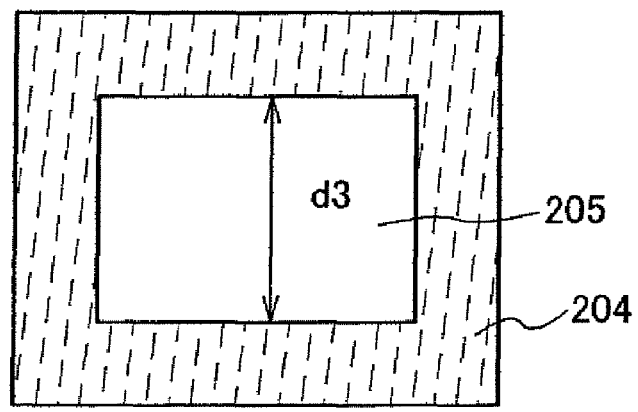
FIGS. 5A and 5B are views showing a film formation apparatus of the present invention.
Figure 5B:
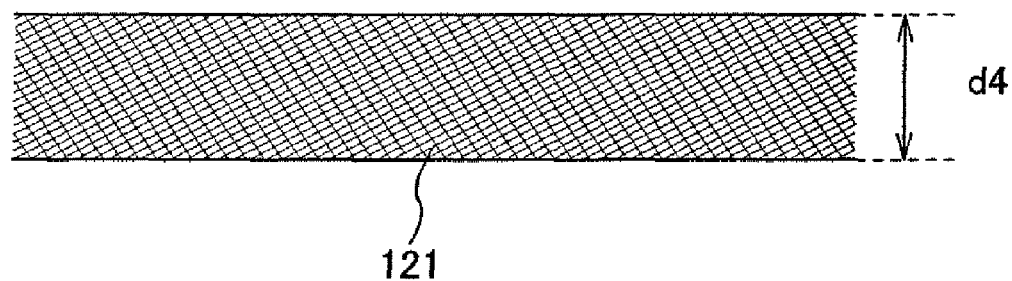

It is certified that error appears in the above-identified patent and that said Letters Patent is hereby corrected as shown below:

Col. 4, line 17, "FIGS. 5A to 5C" should read --FIGS. 8A to 8C--.

Col. 4, line 41, "FIGS. 17A and 1713" should read --FIGS. 17A and 17B--.

Col. 8, line 32, "203;" should read --203$e$,--.

Col. 10, line 12, "FIGS. 5A to 5C" should read --FIGS. 8A to 8C--.

Col. 10, line 16, "(PBS)" should read --(PES)--.

Col. 22, line 30, "of the 604" should read --of the TFT 604--.

Col. 25, line 17, "FIG. 813" should read --FIG. 8B--.

Signed and Sealed this  
Eleventh Day of September, 2012

David J. Kappos  
*Director of the United States Patent and Trademark Office*